US012126924B2

(12) United States Patent
Hanada et al.

(10) Patent No.: US 12,126,924 B2
(45) Date of Patent: Oct. 22, 2024

(54) SOLID-STATE IMAGING DEVICE AND IMAGING DEVICE

(71) Applicant: SONY SEMICONDUCTOR SOLUTIONS CORPORATION, Kanagawa (JP)

(72) Inventors: Takuya Hanada, Kumamoto (JP); Koya Tsuchimoto, Kumamoto (JP); Makoto Nakamura, Kumamoto (JP); Yuki Noda, Kumamoto (JP); Yusuke Murakawa, Kumamoto (JP); Shin Kitano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 61 days.

(21) Appl. No.: 17/797,817

(22) PCT Filed: Jan. 28, 2021

(86) PCT No.: PCT/JP2021/002964
§ 371 (c)(1),
(2) Date: Aug. 5, 2022

(87) PCT Pub. No.: WO2021/161791
PCT Pub. Date: Aug. 19, 2021

(65) Prior Publication Data
US 2023/0059890 A1 Feb. 23, 2023

(30) Foreign Application Priority Data
Feb. 13, 2020 (JP) ................. 2020-022430

(51) Int. Cl.
H04N 25/709 (2023.01)
H01L 27/146 (2006.01)
H04N 25/707 (2023.01)

(52) U.S. Cl.
CPC ..... H04N 25/709 (2023.01); H01L 27/14612 (2013.01); H01L 27/14643 (2013.01); H04N 25/707 (2023.01)

(58) Field of Classification Search
CPC .... H04N 25/709; H04N 25/707; H04N 25/77; H04N 25/79; H04N 25/60; H04N 25/766;
(Continued)

(56) References Cited

U.S. PATENT DOCUMENTS

| 10,204,964 | B1* | 2/2019 | Lee ........................ H10K 19/20 |
| 2011/0049590 | A1 | 3/2011 | Itonaga | |
| 2014/0160332 | A1 | 6/2014 | Sumi | |
| 2015/0194454 | A1* | 7/2015 | Kim ................. H01L 27/14638 |
| | | | | 250/208.1 |

(Continued)

FOREIGN PATENT DOCUMENTS

| JP | JP-H1093358 A | 4/1998 |
| JP | 2013-017095 | 1/2013 |

(Continued)

OTHER PUBLICATIONS

International Search Report and Written Opinion prepared by the Japan Patent Office on Apr. 2, 2021, for International Application No. PCT/JP2021/002964, 2 pgs.

Primary Examiner — Albert H Cutler

(57) ABSTRACT

Please replace the currently pending Abstract with the following amended A solid-state imaging device is provided with a plurality of photoelectric conversion elements, a plurality of current-voltage conversion circuits, a plurality of address event detection circuits, first ground wiring, and second ground wiring. The plurality of photoelectric conversion elements is arranged side by side in a first region. The plurality of current-voltage conversion circuits converts currents output from the plurality of photoelectric conversion elements into voltages, respectively. The plurality of address event detection circuits detects changes in voltages output from the plurality of current-voltage conversion circuits, respectively. The first ground wiring is provided in
(Continued)

a second region located outside the first region, and supplies first ground potential to the plurality of photoelectric conversion elements. The second ground wiring is provided in the second region and supplies second ground potential having a voltage value different from that of the first ground potential to the plurality of current-voltage conversion circuits.

10 Claims, 16 Drawing Sheets

(58) Field of Classification Search
CPC ........ H04N 25/75; H04N 25/70; H04N 25/76; H01L 27/14612; H01L 27/14643; H01L 27/14636; H01L 27/1464; H01L 27/14625
See application file for complete search history.

(56) References Cited

U.S. PATENT DOCUMENTS

| 2016/0126265 | A1  | 5/2016 | Ligozat |
| 2017/0053957 | A1* | 2/2017 | Ueno ................ H01L 27/14601 |
| 2018/0152644 | A1  | 5/2018 | Kondo |
| 2020/0084409 | A1* | 3/2020 | Kobayashi ............ H04N 25/77 |
| 2021/0225941 | A1* | 7/2021 | Huang ................ H01L 31/1013 |
| 2022/0141403 | A1* | 5/2022 | Mandelli ................ H04N 25/47 |
|              |     |        | 348/207.99 |

FOREIGN PATENT DOCUMENTS

| JP | 2016-533140    | 10/2016 |
| JP | 2019-195135    | 11/2019 |
| WO | WO 2019/087471 | 5/2019  |
| WO | WO-2019211949 A1 | 11/2019 |

* cited by examiner

SOLID-STATE IMAGING DEVICE AND IMAGING DEVICE

CROSS REFERENCE TO RELATED APPLICATIONS

This application is a national stage application under 35 U.S.C. 371 and claims the benefit of PCT Application No. PCT/JP2021/002964, having an international filing date of 28 Jan. 2021, which designated the United States, which PCT application claimed the benefit of Japanese Patent Application No. 2020-022430, filed 13 Feb. 2020, the entire disclosures of each of which are incorporated herein by reference.

TECHNICAL FIELD

The present disclosure relates to a solid-state imaging device and an imaging device.

BACKGROUND ART

Recently, an asynchronous solid-state imaging device is proposed in which an address event detection circuit that detects in real time as an address event that a light amount of a pixel exceeds a threshold for each pixel address is provided for each pixel (for example, refer to Patent Document 1).

Furthermore, in an asynchronous solid-state imaging device, a solid-state imaging device that supplies predetermined potential lower than reference potential to an anode of a photodiode and a back gate of an amplification transistor is proposed (refer to, for example, Patent Document 2).

CITATION LIST

Patent Document

Patent Document 1: Japanese Unexamined Patent Publication No. 2016-533140
Patent Document 2: Japanese Patent Application Laid-Open No.

SUMMARY OF THE INVENTION

Problems to be Solved by the Invention

However, the above-described conventional technologies do not disclose a more specific supplying manner of how to supply the predetermined potential having a value different from that of the reference potential to the anode of the photodiode, so that there has been room for examination on the method of supplying the predetermined potential.

Therefore, the present disclosure provides a solid-state imaging device and an imaging device capable of supplying predetermined potential having a value different from that of reference potential to a photodiode.

Solutions to Problems

According to the present disclosure, a solid-state imaging device is provided. A solid-state imaging device is provided with a plurality of photoelectric conversion elements, a plurality of current-voltage conversion circuits, a plurality of address event detection circuits, first ground wiring, and second ground wiring. The plurality of photoelectric conversion elements is arranged side by side in a first region. The plurality of current-voltage conversion circuits converts currents output from the plurality of photoelectric conversion elements into voltages, respectively. The plurality of address event detection circuits detects changes in the voltages output from the plurality of current-voltage conversion circuits, respectively. The first ground wiring is provided in a second region located outside the first region, and supplies first ground potential to the plurality of photoelectric conversion elements. The second ground wiring is provided in the second region and supplies second ground potential having a voltage value different from that of the first ground potential to the plurality of current-voltage conversion circuits.

MODE FOR CARRYING OUT THE INVENTION

Figure 1:
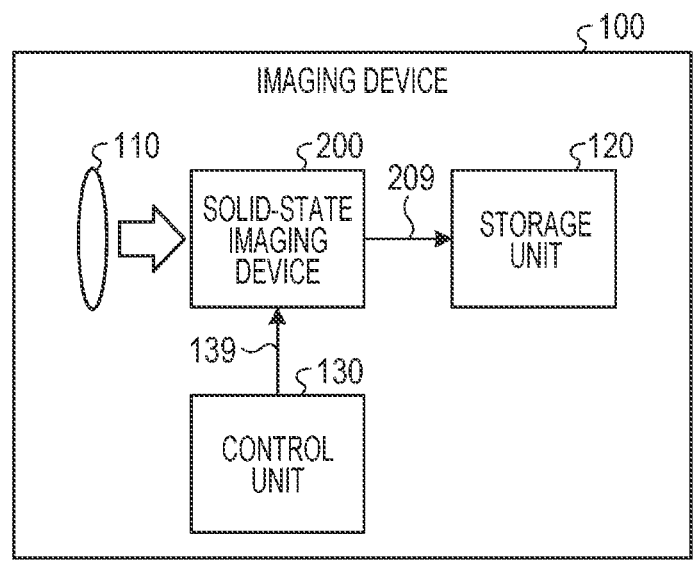
FIG. 1 is a block diagram illustrating a configuration example of an imaging device according to an embodiment of the present disclosure.

A preferred embodiment of the present disclosure is hereinafter described in detail with reference to the accompanying drawings. Note that, in this specification and the drawings, components having substantially the same functional configuration are assigned with the same reference sign and the description thereof is not repeated.

Furthermore, in this specification and the drawings, there is a case in which similar components in different embodiments are distinguished from each other with different alphabets assigned after the same reference sign. However, in a case where it is not necessary to especially distinguish the similar components from each other, only the same reference sign is assigned.

Furthermore, the drawings referred to in the following description are drawings for illustrating the embodiment of the present disclosure and promoting understanding thereof, and shapes, dimensions, ratios and the like in the drawings might be different from actual ones for the sake of clarity. Moreover, a solid-state imaging element and a solid-state imaging device illustrated in the drawings may be appropriately changed in design in consideration of the following description and known technologies. Furthermore, in the description using a cross-sectional view of the solid-state imaging element, a vertical direction of a stacked structure of the solid-state imaging element corresponds to a relative direction of an incident surface on which light is incident on the solid-state imaging element is on a bottom, and this might be different from the vertical direction according to actual acceleration of gravity.

Moreover, in the following description of a circuit configuration, unless otherwise specified, "electrically connected" means that a plurality of elements is connected such that electricity is conducted. In addition, "electrically connected" in the following description includes not only a case of directly and electrically connecting a plurality of elements but also a case of indirectly and electrically connecting them via another element.

Furthermore, in the following description, a "gate" refers to a gate electrode of a field effect transistor (FET). A "drain" refers to a drain electrode or a drain of the FET, and a "source" refers to a source electrode or a source of the FET.

Furthermore, in the following description, description of specific lengths (numerical values) and shapes does not mean only the same values as mathematically defined numerical values or geometrically defined shapes. In detail, the description of specific lengths (numerical values) and shapes in the following description includes a case where there is an allowable difference (error/distortion) in the imaging device, a manufacturing step thereof, and use/operation thereof, and a shape similar to the shape.

Note that, the description is given in the following order.
1. Introduction
2. Configuration Example of Imaging Device
3. Configuration Example of Solid-State Imaging Device
4. Configuration Example of Effective Pixel
5. Configuration Example of Light Reception Unit
  5.1. Regarding Layout Configuration of Light Reception Unit
  5.2. Regarding Cross-Sectional Configuration of Light Reception Unit
6. Detailed Configuration of Solid-State Imaging Device
7. First Variation
8. Second Variation
9. Third Variation
10. Fourth Variation
11. Fifth Variation
12. Application Example
13. Conclusion 1. Introduction Conventionally, a synchronous solid-state imaging element that images image data (frame) in synchronization with a synchronization signal such as a vertical synchronization signal is used in an imaging device and the like. With this general synchronous solid-state imaging element, the image data may be acquired only at each cycle of the synchronization signal (for example, 1/60 seconds), so that it is difficult to cope with a case where higher-speed processing is required in a field regarding traffic, robot and the like.

Therefore, an asynchronous solid-state imaging element is proposed in which an address event detection circuit that detects in real time as an address event that a light amount of a pixel exceeds a threshold for each pixel address is provided for each pixel. In this solid-state imaging element, a photodiode and a plurality of transistors for detecting the address event are arranged for each pixel.

However, in the above-described conventional technology, when a reverse bias of the photodiode decreases due to voltage fluctuation such as a decrease in power supply potential or an increase in ground voltage, sensitivity of the photodiode might be deteriorated. Therefore, there is a problem that a signal quality is deteriorated due to this lack of sensitivity. When an area of the photodiode is increased, the sensitivity may be improved, but the number of pixels per unit area undesirably decreases. Furthermore, the sensitivity may also be improved by sufficiently increasing the power supply potential, but this undesirably increases power consumption. That is, in the above-described conventional technology, it has been difficult to improve the quality of the signal output from an effective pixel.

Therefore, it is expected to implement a technology capable of overcoming the above-described problems and improving the quality of the signal output from the effective pixel.

2. Configuration Example of Imaging Device

First, a configuration of an imaging device 100 according to an embodiment is described with reference to FIG. 1. FIG. 1 is a block diagram illustrating a configuration example of the imaging device 100 according to the embodiment of the present disclosure.

The imaging device 100 according to the embodiment is provided with an imaging lens 110, a solid-state imaging device 200, a recording unit 120, and a control unit 130. As this imaging device 100, a camera mounted on a wearable device, an in-vehicle camera and the like are assumed.

The imaging lens 110 as an example of an optical system captures incident light from a subject to form an image on an imaging surface of the solid-state imaging device 200.

The solid-state imaging device 200 also referred to as a dynamic vision sensor (DVS) detects, as an address event, that an absolute value of an amount of change in luminance exceeds a threshold for each of a plurality of pixels. This address event includes, for example, an on event indicating that an increasing amount of luminance exceeds an upper limit threshold, and an off event indicating that a decreasing amount of luminance falls below a lower limit threshold lower than the upper limit threshold.

Then, the solid-state imaging device 200 generates a detection signal indicating a detection result of the address event for each pixel. Each detection signal includes an on event detection signal $V_{CH}$ (refer to FIG. 6) indicating presence or absence of the on event, and an off event detection signal $V_{CL}$ (refer to FIG. 6) indicating presence or absence of the off event.

The solid-state imaging device 200 executes predetermined signal processing such as image recognition processing on image data including the detection signal, and outputs the processed data to the recording unit 120 via a signal line 209.

The recording unit 120 records the data from the solid-state imaging device 200. The control unit 130 controls the solid-state imaging device 200 and allows such solid-state imaging device 200 to image the image data.

3. Configuration Example of Solid-State Imaging Device

Figure 2:
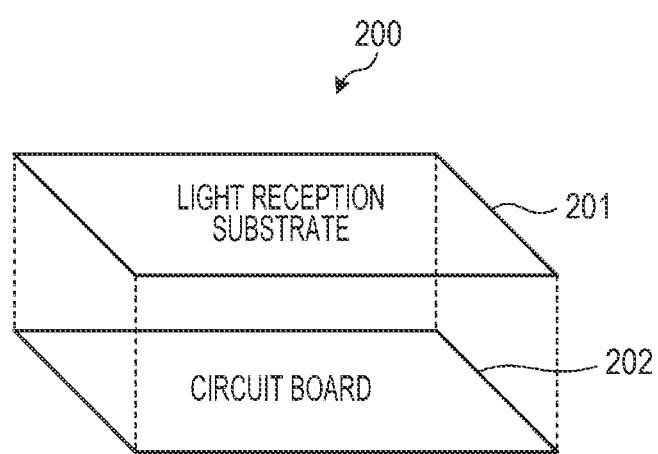
FIG. 2 is a view for illustrating a stacked structure of a solid-state imaging element according to the embodiment of the present disclosure.

Next, a configuration of the solid-state imaging device 200 according to the embodiment is described with reference to FIGS. 2 to 10. FIG. 2 is a view for illustrating a stacked structure of the solid-state imaging device 200 according to the embodiment of the present disclosure.

The solid-state imaging device 200 according to the embodiment is provided with a circuit board 202 and a light reception substrate 201 stacked on such circuit board 202. The light reception substrate 201 and the circuit board 202 are electrically connected to each other via a connection such as a via, Cu—Cu joint, or a bump.

Figure 3:
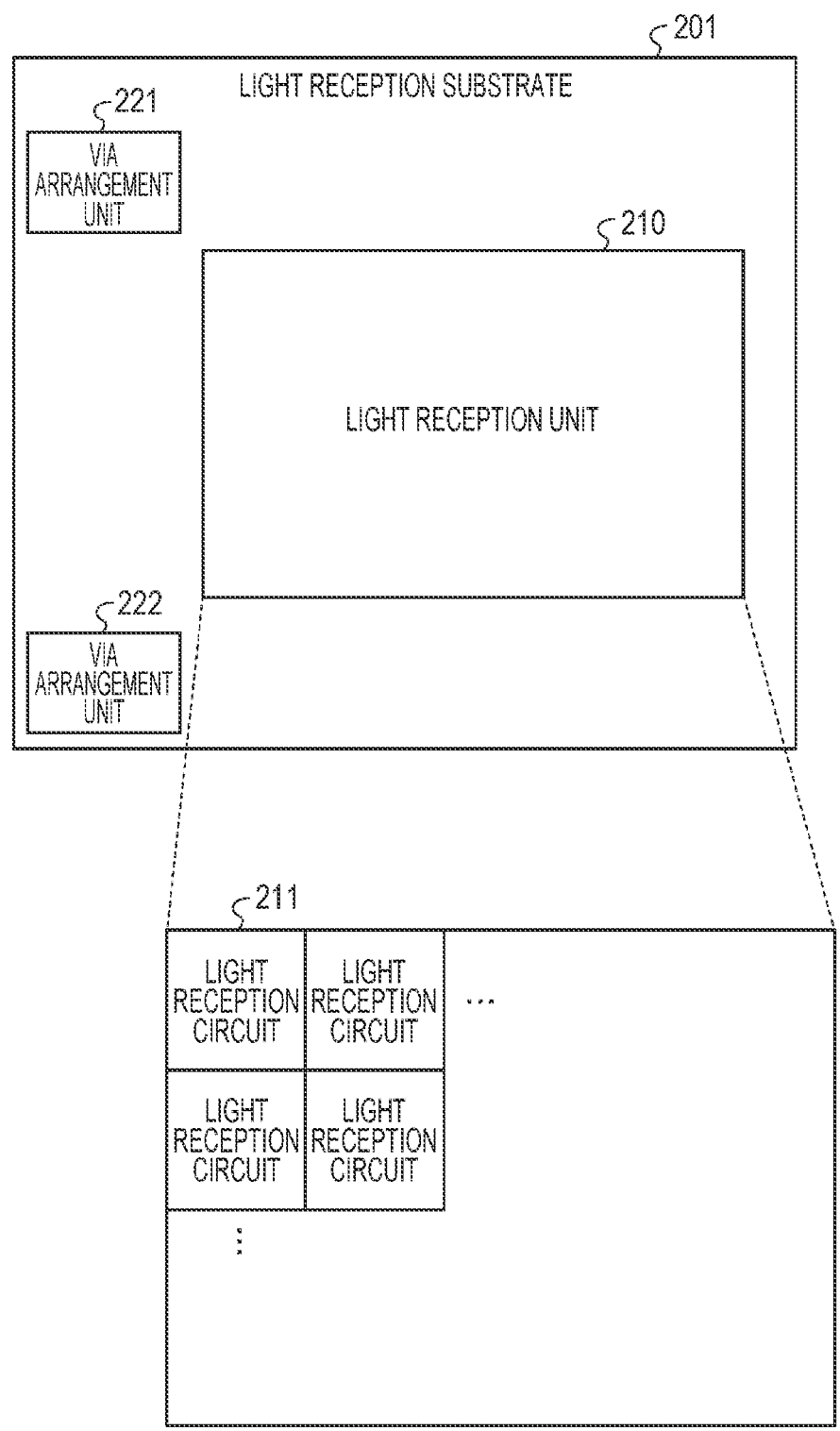
FIG. 3 is a view for illustrating a planar configuration of a light reception substrate according to the embodiment of the present disclosure.

FIG. 3 is a view for illustrating a planar configuration of the light reception substrate 201 according to the embodiment of the present disclosure. As illustrated in FIG. 3, the light reception substrate 201 includes a light reception unit 210, a via arrangement unit 221, and a via arrangement unit 222.

In the light reception unit 210, a plurality of light reception circuits 211 is arranged in a two-dimensional lattice manner. Such light reception circuit 211 photoelectrically converts the incident light to generate a photocurrent, and converts the photocurrent into a voltage to output a voltage signal. A pixel address including a row address and a column address is assigned to each of the light reception circuits 211.

A via connected to the circuit board 202 (refer to FIG. 4) is arranged in the via arrangement unit 221 and the via arrangement unit 222.

Figure 4:
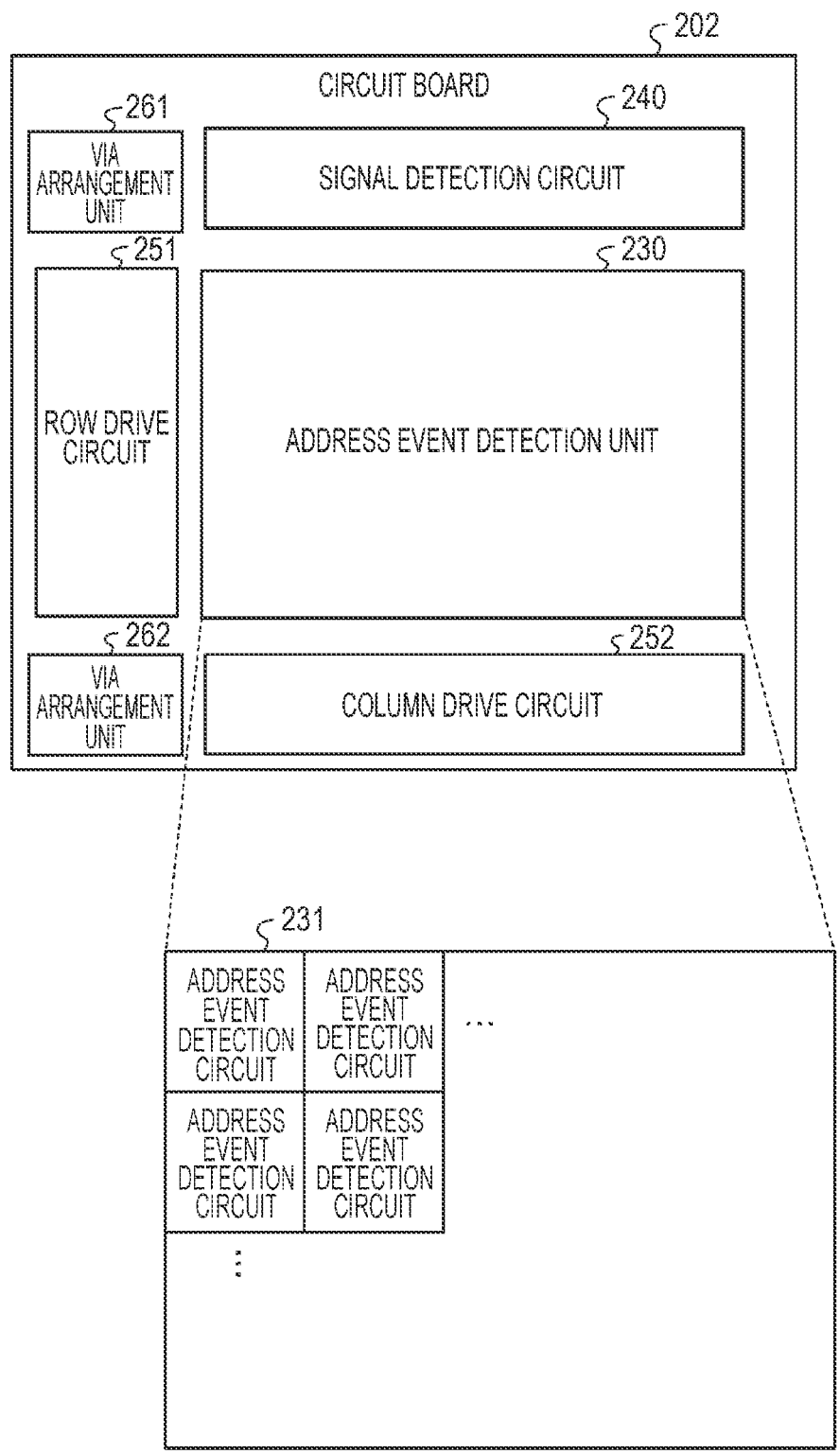
FIG. 4 is a view for illustrating a planar configuration of a circuit board according to the embodiment of the present disclosure.

FIG. 4 is a view for illustrating a planar configuration of the circuit board 202 according to the embodiment of the present disclosure. As illustrated in FIG. 4, the circuit board 202 includes an address event detection unit 230, a signal processing circuit 240, a row drive circuit 251, a column drive circuit 252, a via arrangement unit 261, and a via arrangement unit 262.

In the address event detection unit 230, a plurality of address event detection circuits 231 is arranged in a two-dimensional lattice manner. The address event detection circuit 231 quantizes the voltage signal from the light reception circuit 211 and outputs such quantized voltage signal as the detection signal.

Each of the address event detection circuits 231 to which a pixel address is assigned is electrically connected to the light reception circuit 211 having the same address. Furthermore, in the embodiment, the light reception circuit 211 and the address event detection circuit 231 having the same address are arranged at the same position in plan view.

The signal processing circuit 240 executes predetermined signal processing on the detection signal from the address event detection unit 230. For example, the signal processing circuit 240 arranges such detection signals as pixel signals in a two-dimensional lattice manner, and acquires the image data having 2-bit information for each pixel. Then, the signal processing circuit 240 executes signal processing such as image recognition processing on the acquired image data.

The row drive circuit 251 selects the row address and allows the address event detection unit 230 to output the detection signal corresponding to the selected row address. The column drive circuit 252 selects the column address and allows the address event detection unit 230 to output the detection signal corresponding to the selected column address. A via connected to the light reception substrate 201 (refer to FIG. 3) is arranged in the via arrangement unit 261 and the via arrangement unit 262.

4. Configuration Example of Effective Pixel

Figure 5:
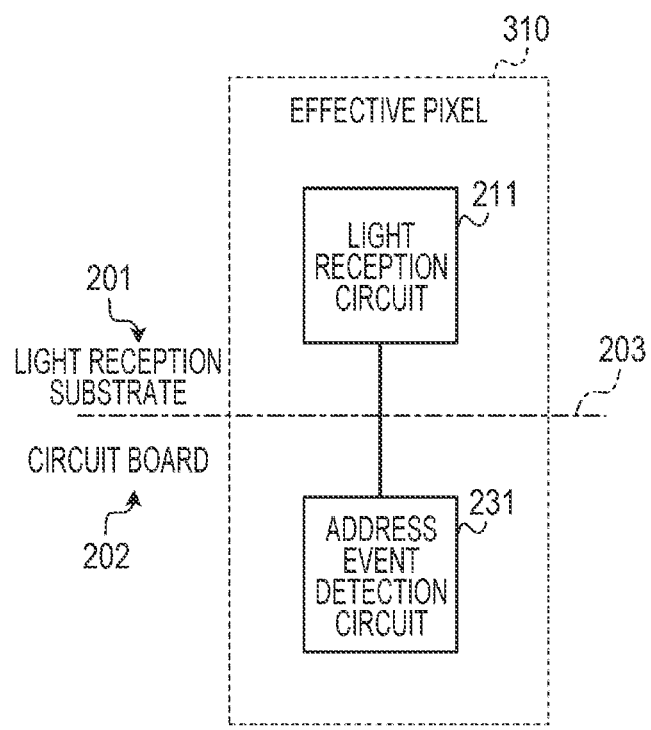
FIG. 5 is a view for illustrating a configuration of an effective pixel according to the embodiment of the present disclosure.

FIG. 5 is a view for illustrating a configuration of an effective pixel 310 according to the embodiment of the present disclosure. As illustrated in FIG. 5, each effective pixel 310 includes the light reception circuit 211 in the light reception substrate 201 and the address event detection circuit 231 in the circuit board 202 to which the same pixel address is assigned.

As described above, on the light reception substrate 201 and the circuit board 202, a plurality of light reception circuits 211 and a plurality of address event detection circuits 231 are arranged in a two-dimensional lattice manner, respectively. Furthermore, the light reception circuit 211 and the address event detection circuit 231 having the same address are arranged at the same position in plan view.

That is, in the solid-state imaging device 200 according to the embodiment, the effective pixels 310 each including a pair of the light reception circuit 211 and the address event detection circuit 231 are arranged in a two-dimensional lattice manner. Then, the pair of the light reception circuit 211 and the address event detection circuit 231 are electrically connected to each other via the connection such as the via, Cu—Cu joint, or bump at a joint 203.

Figure 6:
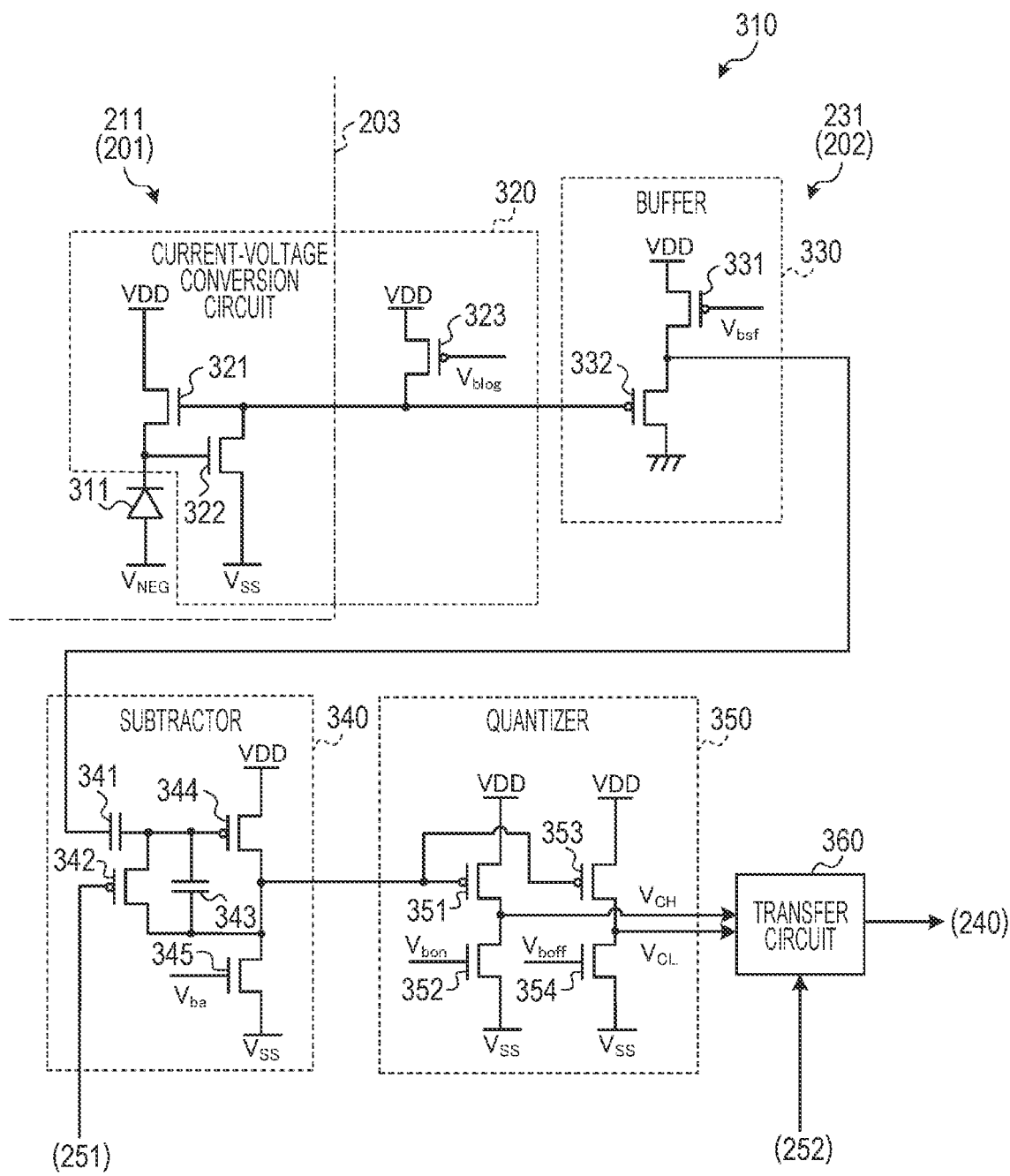
FIG. 6 is a view illustrating a circuit configuration of the effective pixel according to the embodiment of the present disclosure.

FIG. 6 is a view illustrating a circuit configuration of the effective pixel 310 according to the embodiment of the present disclosure. As illustrated in FIG. 6, the effective pixel 310 is provided with a photodiode 311, a current-voltage conversion circuit 320, a buffer 330, a subtractor 340, a quantizer 350, and a transfer circuit 360.

(Effective Pixel)

In the embodiment of the present disclosure, among the units of such effective pixel 310, the photodiode 311, and an LG transistor 321 (an example of a first transistor) and an amplification transistor 322 (an example of a second transistor) of the current-voltage conversion circuit 320 are included in the light reception circuit 211. Furthermore, among the units of the effective pixel 310, the buffer 330, the subtractor 340, the quantizer 350, and the transfer circuit 360 are included in the address event detection circuit 231.

That is, in the embodiment of the present disclosure, the effective pixel 310 includes the photodiode 311, the current-voltage conversion circuit 320, and the address event detection circuit 231.

The photodiode 311 photoelectrically converts the incident light to generate the photocurrent. Then, the photodiode 311 supplies the generated photocurrent to the current-voltage conversion circuit 320.

The current-voltage conversion circuit 320 converts the photocurrent from the photodiode 311 into a voltage signal of its logarithm. Then, the current-voltage conversion circuit 320 supplies the converted voltage signal to the buffer 330.

The buffer 330 corrects the voltage signal transmitted from the current-voltage conversion circuit 320 and outputs this corrected signal to the subtractor 340. In the effective pixel 310 according to the embodiment, it is possible to improve a drive force for driving a subsequent stage and to secure isolation of noise accompanying a switching operation of the subsequent stage by such buffer 330.

The subtractor 340 obtains an amount of change in the corrected signal transmitted from the buffer 330 by subtraction processing. Then, the subtractor 340 supplies the obtained change amount to the quantizer 350 as a differential signal.

The quantizer 350 converts (that is, quantizes) an analog differential signal into a digital detection signal by comparing the differential signal with a predetermined threshold. The quantizer 350 according to the embodiment compares the differential signal with each of an upper limit threshold and a lower limit threshold, and supplies comparison results to the transfer circuit 360 as a 2-bit detection signal.

The transfer circuit 360 transfers the detection signal to the signal processing circuit 240 according to a column drive signal from the column drive circuit 252.

A specific circuit configuration of each unit is described below.
(Photodiode)

A cathode of the photodiode 311 is connected to a source of the LG transistor 321 of the current-voltage conversion circuit 320 to be described later. Furthermore, an anode of the photodiode 311 is connected to a terminal of first ground potential $V_{NEG}$. In this manner, the first ground potential $V_{NEG}$ is supplied to the photodiode 311. Note that, the first ground potential $V_{NEG}$ is described later.
(Current-Voltage Conversion Circuit)

The current-voltage conversion circuit 320 includes the LG transistor 321, the amplification transistor 322, and a constant current circuit 323. As the LG transistor 321 and the amplification transistors 322, for example, an N-type metal-oxide-semiconductor (MOS) transistor is used. Furthermore, as the constant current circuit 323, for example, a load MOS transistor such as a P-type MOS transistor is used.

The source and a drain of the LG transistor 321 are connected to the cathode of the photodiode 311 and a terminal of power supply potential VDD, respectively. The anode of the photodiode 311 is connected to a terminal of ground potential.

The constant current circuit 323 and the amplification transistor 322 are connected in series in this order between the terminal of the power supply potential VDD and a terminal of second ground potential $V_{SS}$. Note that, the second ground potential $V_{SS}$ is described later.

A connection point between the constant current circuit 323 and the amplification transistor 322 is connected to a gate of the LG transistor 321 and an input terminal of the buffer 330. A connection point between the LG transistor 321 and the photodiode 311 is connected to a gate of the amplification transistor 322. A predetermined bias voltage $V_{blog}$ is applied to a gate of the constant current circuit 323.

Then, the LG transistor 321 converts the photocurrent generated by the photodiode 311 into a voltage between the gate and the source, and the amplification transistor 322 amplifies the voltage between the gate of potential corresponding to such photocurrent and a source of the ground potential, and outputs the same from a drain.

Furthermore, the constant current circuit 323 supplies a constant current based on the bias voltage $V_{blog}$ to the amplification transistor 322. By such configuration, the current-voltage conversion circuit 320 converts the photocurrent from the photodiode 311 into the voltage signal.

In this manner, the current-voltage conversion circuit 320 is a so-called source follower current-voltage conversion circuit provided with the amplification transistor 322, the constant current circuit 323, and the constant current circuit 323.

Note that, in the solid-state imaging device 200 according to the embodiment, the photodiode 311, the LG transistor 321, and the amplification transistor 322 are arranged on the light reception substrate 201, and the circuits subsequent to the constant current circuit 323 are arranged on the circuit board 202.

Figure 7:
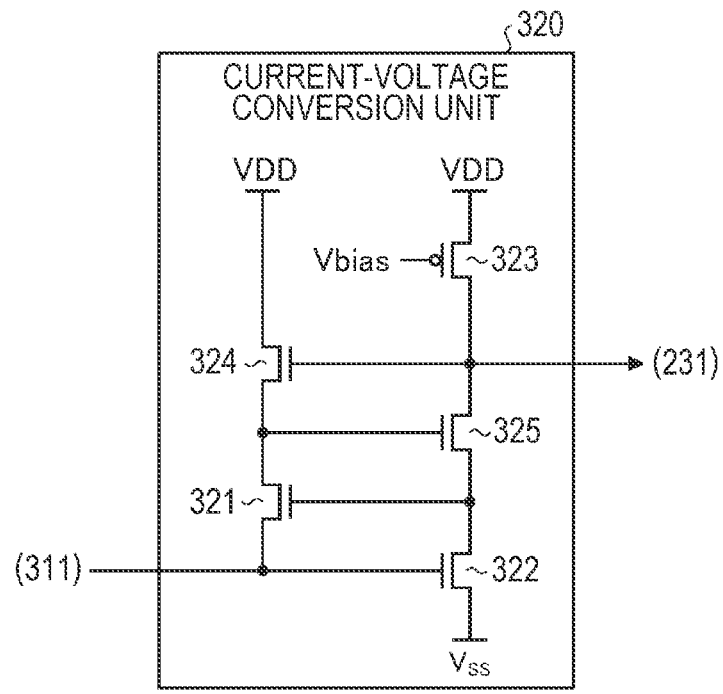
FIG. 7 is a view illustrating another circuit configuration of a current-voltage conversion circuit according to the embodiment of the present disclosure.

Here, another configuration example of the current-voltage conversion circuit 320 is described with reference to FIG. 7. FIG. 7 is a view illustrating another circuit configuration of the current-voltage conversion circuit 320 according to the embodiment of the present disclosure. As illustrated in FIG. 7, the current-voltage conversion circuit 320 may also be a so-called gain boost current-voltage conversion circuit provided with two LG transistors 321 and 324, two amplification transistors 322 and 325, and the constant current circuit 323.

In a case of the gain boost type, as illustrated in FIG. 7, the source of the LG transistor 321 and the gate of the amplification transistor 322 are connected to, for example, the cathode of the photodiode 311. Furthermore, the drain of the LG transistor 321 is connected to, for example, a source of the LG transistor 324 (an example of a third transistor) and a gate of the amplification transistor 325. A drain of the LG transistor 324 is connected to the terminal of the power supply potential VDD, for example.

Furthermore, for example, a source of the amplification transistor 325 (an example of a fourth transistor) is connected to the gate of the LG transistor 321 and the drain of the amplification transistor 322. A drain of the amplification transistor 325 is connected to the terminal of the power supply potential VDD via the constant current circuit 323, for example.

A loop-shaped source follower circuit is formed by allowing the current-voltage conversion circuit 320 to have a connection relationship as illustrated in FIG. 6 or 7. Therefore, the photocurrent from the photodiode 311 is converted into the voltage signal of the logarithmic value according to a charge amount thereof. Note that, each of the LG transistor 324 and the amplification transistor 325 may include, for example, an N-type MOS transistor.

($V_{NEG}$ and $V_{SS}$)

Figure 8:
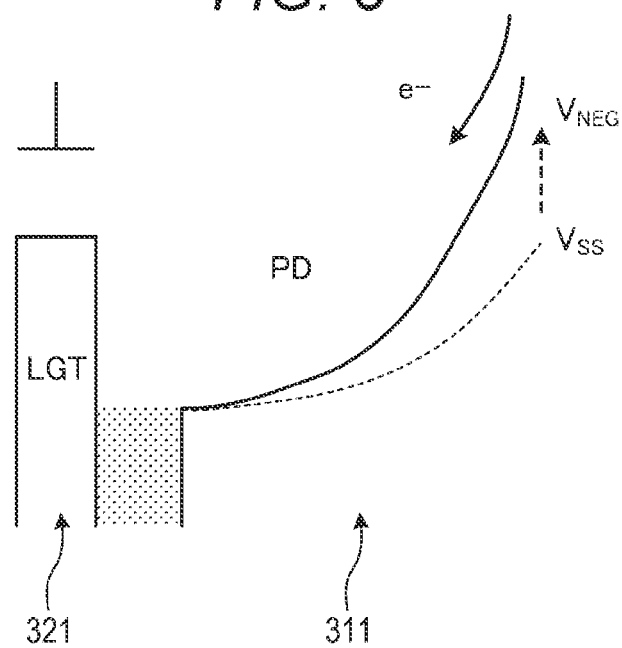
FIG. 8 is a view for illustrating first ground potential and second ground potential according to the embodiment of the present disclosure.

Next, the first ground potential $V_{NEG}$ and the second ground potential $V_{SS}$ described above are described with reference to FIG. 8. FIG. 8 is a view for illustrating the first ground potential $V_{NEG}$ and the second ground potential $V_{SS}$ according to the embodiment of the present disclosure.

As described above, the first ground potential $V_{NEG}$ is applied to the anode of the photodiode 311, and the second ground potential $V_{SS}$ is applied to the source of the amplification transistor 322 of the current-voltage conversion circuit 320 (refer to FIG. 6). A voltage value of the first ground potential $V_{NEG}$ is set to, for example, a negative bias so as to be smaller than a voltage value of the second ground potential $V_{SS}$. In a case where the voltage value of the second ground potential $V_{SS}$ is "0 V", the voltage value of the first ground potential $V_{NEG}$ is set to, for example, about "−1 V".

In this manner, by applying the first ground potential $V_{NEG}$ to the anode of the photodiode 311, a potential gradient of the photodiode 311 may be increased as illustrated in FIG. 8. Note that, in FIG. 8, the photodiode 311 is represented by PD, and the LG transistor 321 is represented by LGT. As illustrated in FIG. 8, as the potential gradient of the photodiode 311 increases, a charge ("e-" in FIG. 8) generated in the photodiode 311 is easily transferred to the LG transistor 321. Therefore, sensitivity of the photodiode 311 may be improved, and a quality of the signal output from the effective pixel may be improved.

(Buffer)

It is described with reference to FIG. 6 again. The buffer 330 includes a P-type transistor 331 and a P-type transistor 332. As the P-type transistor 331 and the P-type transistor 332, for example, a MOS transistor is used.

The P-type transistor 331 and the P-type transistor 332 are connected in series in this order between the terminal of the power supply potential VDD and the terminal of the second ground potential $V_{SS}$. A predetermined bias voltage $V_{bsf}$ is applied to a gate of the P-type transistor 331. A gate of the P-type transistor 332 is connected to an output terminal of the current-voltage conversion circuit 320.

With such a configuration, the buffer 330 outputs the corrected voltage signal from a connection point between the P-type transistor 331 and the P-type transistor 332 to the subtractor 340.

(Subtractor)

The subtractor 340 includes a capacitor 341, a P-type transistor 342, a capacitor 343, a P-type transistor 344, and an N-type transistor 345. As the P-type transistor 342, the P-type transistor 344, and the N-type transistor 345, for example, a MOS transistor is used.

The P-type transistor 344 and the N-type transistor 345 are connected in series in this order between the terminal of the power supply potential VDD and the terminal of the second ground potential $V_{SS}$. A predetermined bias voltage $V_{ba}$ is applied to a gate of the N-type transistor 345.

The P-type transistor 344 and the N-type transistor 345 serve as an inverter that inverts an input signal to output in a case where a gate of the P-type transistor 344 is made an input terminal and a connection point between the P-type transistor 344 and the N-type transistor 345 is made an output terminal.

One end of the capacitor 341 is connected to an output terminal of the buffer 330 and the other end thereof is connected to the input terminal of the inverter (that is, the gate of the P-type transistor 344). One end of the capacitor 343 is connected to the input terminal of the inverter, and other end thereof is connected to the output terminal of the inverter (that is, the connection point between the P-type transistor 344 and the N-type transistor 345).

The P-type transistor 342 opens and closes a path connecting both ends of the capacitor 343 according to a row drive signal output from the row drive circuit 251.

When the P-type transistor 342 is turned on, a voltage signal $V_{init}$ is input to a buffer 330 side of the capacitor 341, and the opposite side becomes a virtual ground terminal. Potential of this virtual ground terminal is set to zero for convenience.

At that time, a charge $Q_{init}$ accumulated in the capacitor 341 is expressed by following expression (1) when capacitance of the capacitor 341 is set to C1. In contrast, since both the ends of the capacitor 343 are short-circuited, an accumulated charge thereof is zero.

$$Q_{init} = C1 \times V_{init} \quad (1)$$

Next, considering a case where the P-type transistor 342 is turned off and the voltage on the buffer 330 side of the capacitor 341 changes to become $V_{after}$, a charge $Q_{after}$ accumulated in the capacitor 341 is expressed by following expression (2).

$$Q_{after} = C1 \times V_{after} \quad (2)$$

In contrast, a charge Q2 accumulated in the capacitor 343 is expressed by following expression (3) when capacitance of the capacitor 343 is set to C2 and an output voltage thereof is set to $V_{out}$.

$$Q2 = -C2 \times V_{out} \quad (3)$$

At that time, a total charge amount of the capacitor 341 and the capacitor 343 does not change, so that following expression (4) holds.

$$Q_{init} = Q_{after} + Q2 \quad (4)$$

Then, by substituting expressions (1) to (3) into expression (4) above and transforming, following expression (5) is obtained.

$$V_{out} = -(C1/C2) \times (V_{after} - V_{init}) \quad (5)$$

Expression (5) above expresses a subtraction operation of the voltage signal, and a gain of a subtraction result is C1/C2. Since it is generally desired to maximize the gain, it is preferable to design the capacitance C1 larger and the capacitance C2 smaller. In contrast, when the capacitance C2 is too small, kTC noise increases and a noise characteristic might be deteriorated, so that a reduction in capacitance of the capacitance C2 is limited to a range in which the noise is allowable.

Furthermore, since the subtractor 340 is mounted on each effective pixel 310, there is a limitation in area in the capacitance C1 and the capacitance C2. In view of them, for example, the capacitance C1 is set to a value of 20 to 200 femtofarad (fF), and the capacitance C2 is set to a value of 1 to 20 femtofarad (fF).

(Quantizer)

The quantizer 350 includes a P-type transistor 351, an N-type transistor 352, a P-type transistor 353, and an N-type transistor 354. As the P-type transistors 351, the N-type transistor 352, the P-type transistor 353, and the N-type transistor 354, for example, a MOS transistor is used.

The P-type transistor 351 and the N-type transistor 352 are connected in series in this order between the terminal of the power supply potential VDD and the terminal of the second ground potential $V_{SS}$. The P-type transistor 353 and the N-type transistor 354 are connected in series in this order between the terminal of the power supply potential VDD and the terminal of the second ground potential $V_{SS}$.

Furthermore, a gate of the P-type transistor 351 and a gate of the P-type transistor 353 are connected to an output terminal of the subtractor 340. A bias voltage $V_{bon}$ indicating an upper limit threshold is applied to a gate of the N-type transistor 352, and a bias voltage $V_{boff}$ indicating a lower limit threshold is applied to a gate of the N-type transistor 354.

A connection point between the P-type transistor 351 and the N-type transistor 352 is connected to the transfer circuit 360. In the quantizer 350, a voltage at such connection point is output to the transfer circuit 360 as the on event detection signal $V_{CH}$.

A connection point between the P-type transistor 353 and the N-type transistor 354 is connected to the transfer circuit 360. In the quantizer 350, a voltage at such connection point is output as the off event detection signal $V_{CL}$.

With such configuration, the quantizer 350 outputs the on event detection signal $V_C$ at a high level in a case where the differential signal exceeds the upper limit threshold, and outputs the off event detection signal $V_{CL}$ at a low level in a case where the differential signal falls below the lower limit threshold. That is, the solid-state imaging element 200 according to the embodiment may simultaneously detect presence or absence of both the on event and off event.

Note that, it is described that the second ground potential $V_{SS}$ the same as that of the current-voltage conversion circuit 320 is supplied to the buffer 330, the subtractor 340, and the quantizer 350, but there is no limitation. As described above, the photodiode 311, the LG transistor 321, and the amplification transistor 322 are arranged on the light reception substrate 201, and the circuits subsequent to the constant current circuit 323 are arranged on the circuit board 202. Therefore, different ground potential may be supplied to different substrates (the light reception substrate 201 and the circuit board 202).

5. Configuration Example of Light Reception Unit

<5.1. Regarding Layout Configuration of Light Reception Unit>

Figure 9:
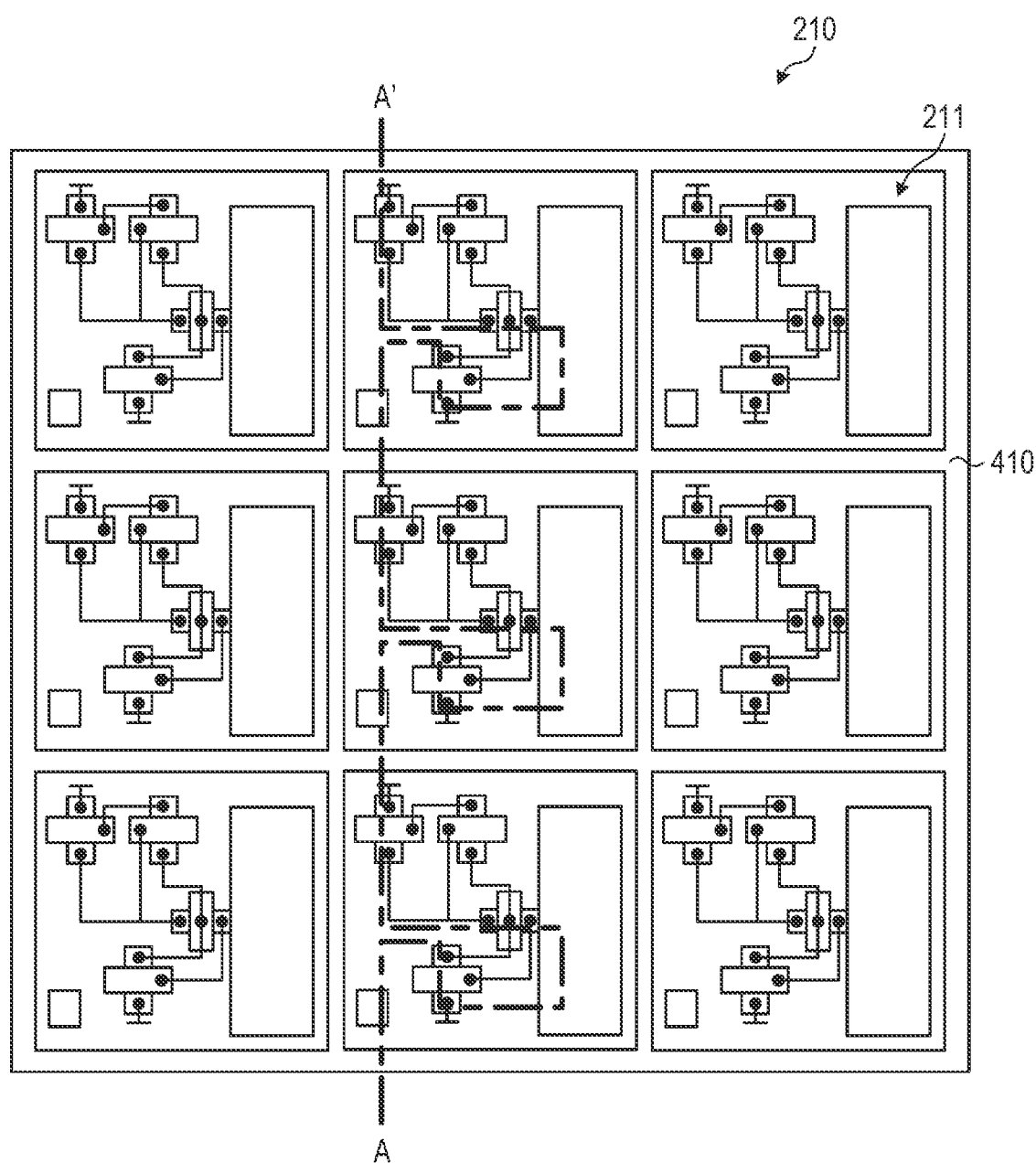
FIG. 9 is a view for illustrating a layout configuration of a light reception unit according to the embodiment of the present disclosure.

FIG. 9 is a view for illustrating a layout configuration of the light reception unit 210 according to the embodiment of the present disclosure. FIG. 9 is a plan view of the light reception unit 210 illustrating a cross section obtained by cutting the light reception substrate 201 in a stacking direction of the light reception substrate 201.

The light reception unit 210 includes a plurality of light reception circuits 211 arranged in a matrix. In FIG. 9, 3×3 light reception circuits 211 are illustrated, but the number of light reception circuits 211 is not limited thereto, and may be less than 3×3 or may be more than 3×3. The light reception circuit 211 is isolated by a pixel isolation unit 410.

Figure 10:
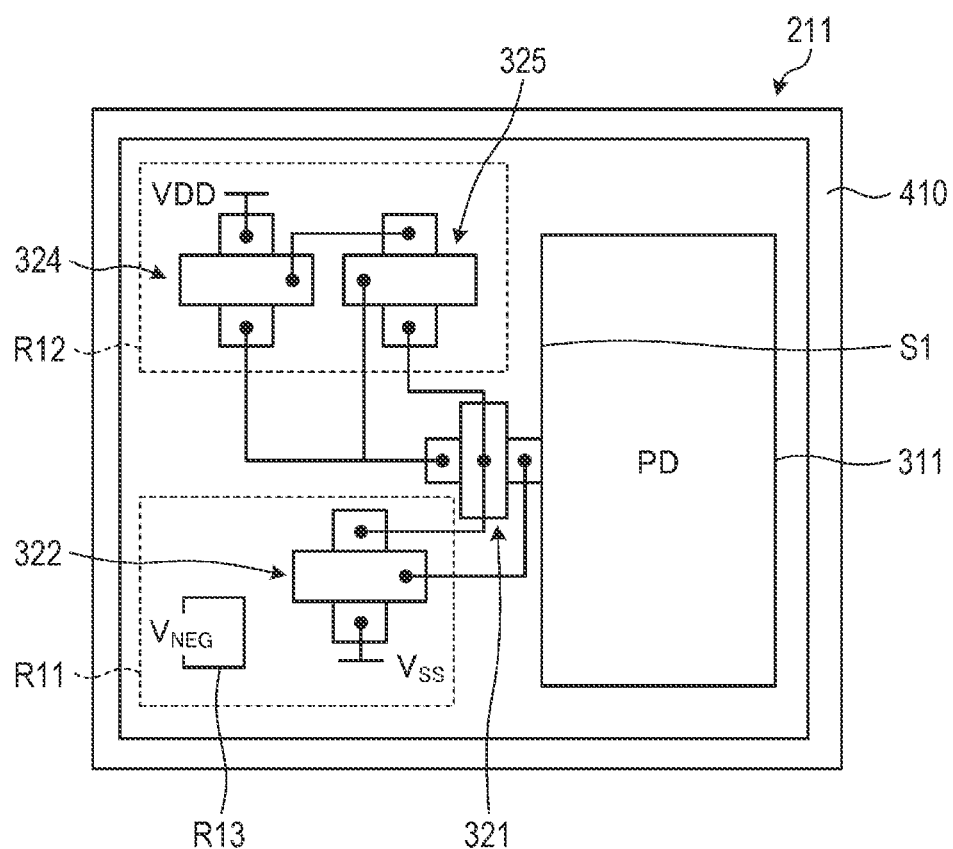
FIG. 10 is a view for illustrating a layout configuration of a light reception circuit according to the embodiment of the present disclosure.

Here, a layout configuration of the light reception circuit 211 is described with reference to FIG. 10. FIG. 10 is a view for illustrating the layout configuration of the light reception circuit 211 according to the embodiment of the present disclosure. FIG. 10 is a plan view of the light reception circuit 211 illustrating a cross section obtained by cutting the light reception substrate 201 in the stacking direction of the light reception substrate 201.

As illustrated in FIG. 10, the source of the LG transistor 321 is connected to the substantial center of a side S1 of the photodiode 311. Such side S1 is a side having the longest distance from the pixel isolation unit 410 among a plurality of sides of the photodiode 311. The LG transistor 321 is formed so as to extend in a first direction (lateral direction in FIG. 10). The first direction is, for example, a direction substantially perpendicular to the side S1. That is, the LG transistor 321 is formed such that the source is arranged closer to the side S1 than the drain.

Moreover, the amplification transistor 322 is formed on a drain side of the LG transistor 321, in a region R11 (an example of a third region) closer to the pixel isolation unit 410 than the LG transistor 321. Furthermore, the amplification transistor 322 is formed so as to extend in a second direction (longitudinal direction in FIG. 10) substantially perpendicular to the first direction. The second direction is, for example, a direction substantially parallel to the side S1. That is, this is formed such that the distance from the source of the amplification transistor 322 to the side S1 is substantially equal to the distance from the drain of the amplification transistor 322 to the side S1.

The LG transistor 324 and the amplification transistor 325 are formed on the drain side of the LG transistor 321, in a region R12 (an example of a fourth region) different from the region R11 in which the amplification transistor 322 is formed. The region R12 is the region closer to the pixel isolation unit 410 than the LG transistor 321 on the drain side of the LG transistor 321. The region R12 is arranged at a position facing the region R11 with the LG transistor 321 interposed therebetween. In the example in FIG. 10, the amplification transistor 325 is arranged closer to the side S1 of the photodiode 311 than the LG transistor 324.

Furthermore, similarly to the amplification transistor 322, the LG transistor 324 and the amplification transistor 325 are formed so as to extend in the second direction. That is, the distance between the source of the LG transistor 324 and the side S1 is substantially the same as the distance between the drain of the LG transistor 324 and the side S1. Furthermore, the distance between the source of the amplification transistor 325 and the side S1 is substantially the same as the distance between the drain of the amplification transistor 325 and the side S1.

Furthermore, the first ground potential $V_{NEG}$ is supplied to the photodiode 311 via a contact region R13 in the region R11 in which the amplification transistor 322 is formed. Furthermore, the second ground potential $V_{SS}$ is applied to the source of the amplification transistor 322, and the power supply potential VDD is applied to the drain of the LG transistor 324.

By laying out the light reception circuit 211 as illustrated in FIG. 10, a circuit area of the light reception circuit 211 may be further reduced. Furthermore, by laying out the light reception circuit 211 as illustrated in FIG. 10, wiring of each transistor may be shortened, and an influence of parasitic capacitance generated in the wiring may further be reduced. Furthermore, by arranging the LG transistor 321 adjacent to the photodiode 311, the charge may be more easily transferred from the photodiode 311.

Note that, FIG. 10 illustrates a layout example of the LG transistors 321 and 324 and the amplification transistors 322 and 325 of the gain boost current-voltage conversion circuit 320, but the layout configuration of the light reception circuit 211 is not limited to the example in FIG. 10. For example, the LG transistor 324 and the amplification transistor 325 in FIG. 10 may be omitted. Such layout example corresponds to the current-voltage conversion circuit 320 illustrated in FIG. 6. In this case, for example, by arranging the contact region R13 to which $V_{NEG}$ is applied on the drain side of the LG transistor 321, in a region (for example, the region R12 in FIG. 10) different from the region R11 in which the amplification transistor 322 is formed, the circuit area of the light reception circuit 211 may be further reduced.

Furthermore, it is described that the LG transistor 324 and the amplification transistors 322 and 325 are formed so as to extend in the second direction, but there is no limitation. For example, the LG transistor 324 and the amplification transistors 322 and 325 may be formed so as to extend in the first direction. In this case, for example, by forming such that both the LG transistor 324 and amplification transistor 325 are arranged at substantially the same distance from the side S1, a wiring length of each transistor may be shortened.

Furthermore, in FIG. 10, it is illustrated that the source of the LG transistor 321 is connected to the substantial center of the side S1 of the photodiode 311, but it is not required that the substantial center is the physical center of the side S1. The LG transistor 321 only needs to be located between the region R11 in which the amplification transistor 322 is formed and the region R12 in which the LG transistor 324 and the amplification transistor 325 are formed, and the LG transistor 321 may be deviated from the physical center of the side S1.

<5.2. Regarding Cross-Sectional Configuration of Light Reception Unit>

Figure 11:
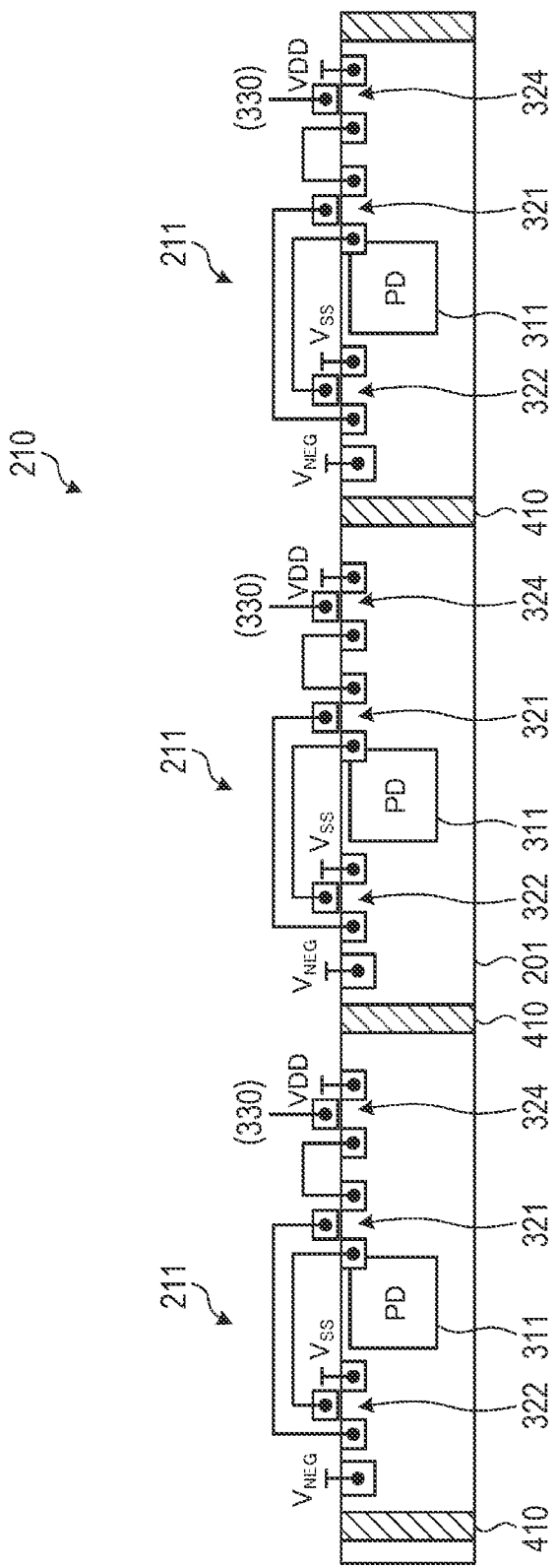
FIG. 11 is a cross-sectional view of the light reception unit taken along line A-A' in FIG. 9.

FIG. 11 is a cross-sectional view of the light reception unit 210 taken along line A-A' in FIG. 9.

As illustrated in FIG. 11, the light reception circuit 211 in which the photodiode 311 is embedded in a P-well region of the light reception substrate 201 is separated by the pixel isolation unit 410. Furthermore, back gates of the LG transistors 321 and 324 and the amplification transistor 322 are formed in the P-well region of the light reception substrate 201.

The power supply potential VDD is supplied to the drain of the LG transistor 324, and the second ground potential $V_{SS}$ is supplied to the source of the amplification transistor 322. Furthermore, when the first ground potential $V_{NEG}$ is applied to the P-well region of the light reception substrate 201, the first ground potential $V_{NEG}$ is supplied to the anode of the photodiode 311, and the back gates of the LG transistors 321 and 324 and the amplification transistor 322.

6. Detailed Configuration of Solid-State Imaging Device

Figure 12:
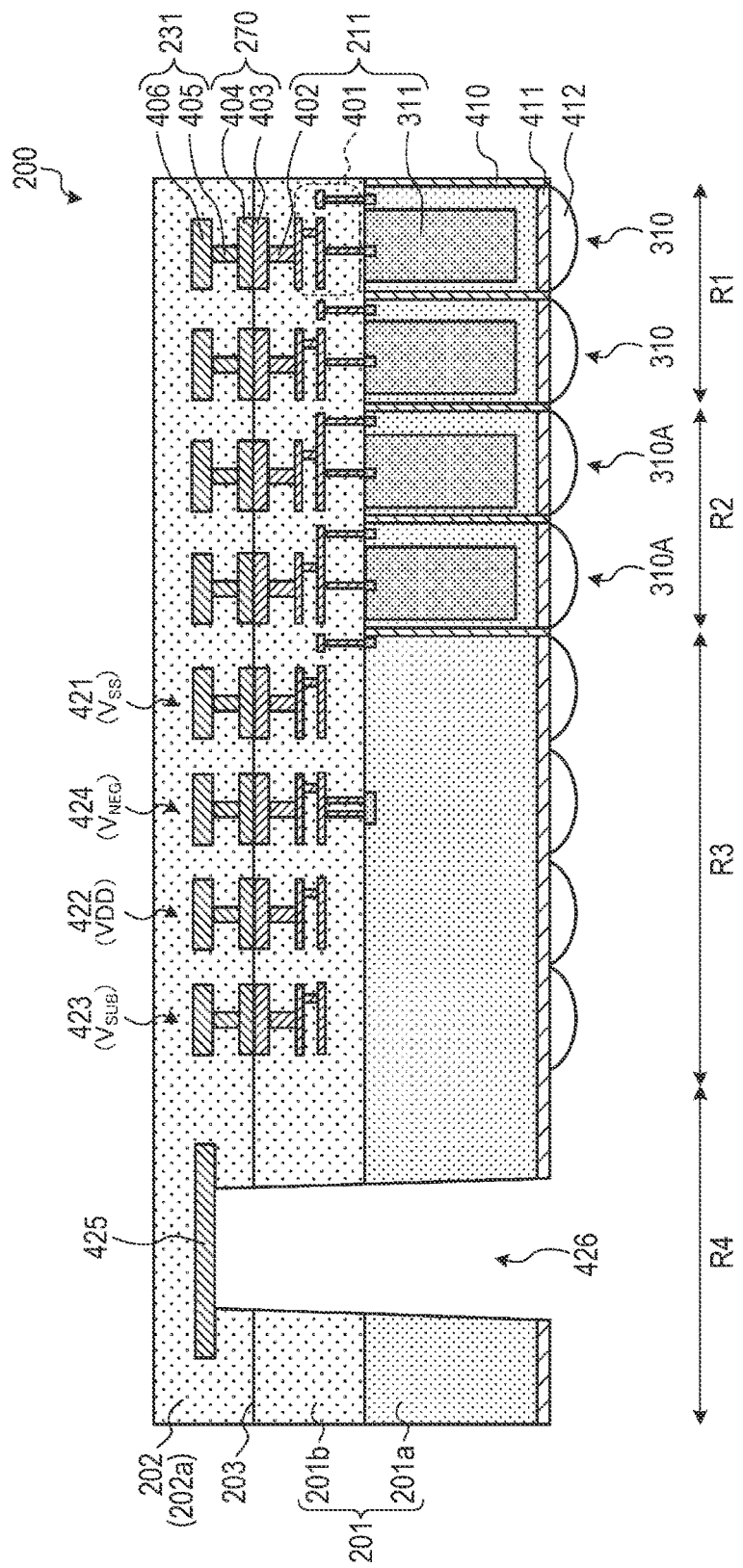
FIG. 12 is a view illustrating a cross-sectional configuration of the solid-state imaging device according to the embodiment of the present disclosure.
Figure 13:
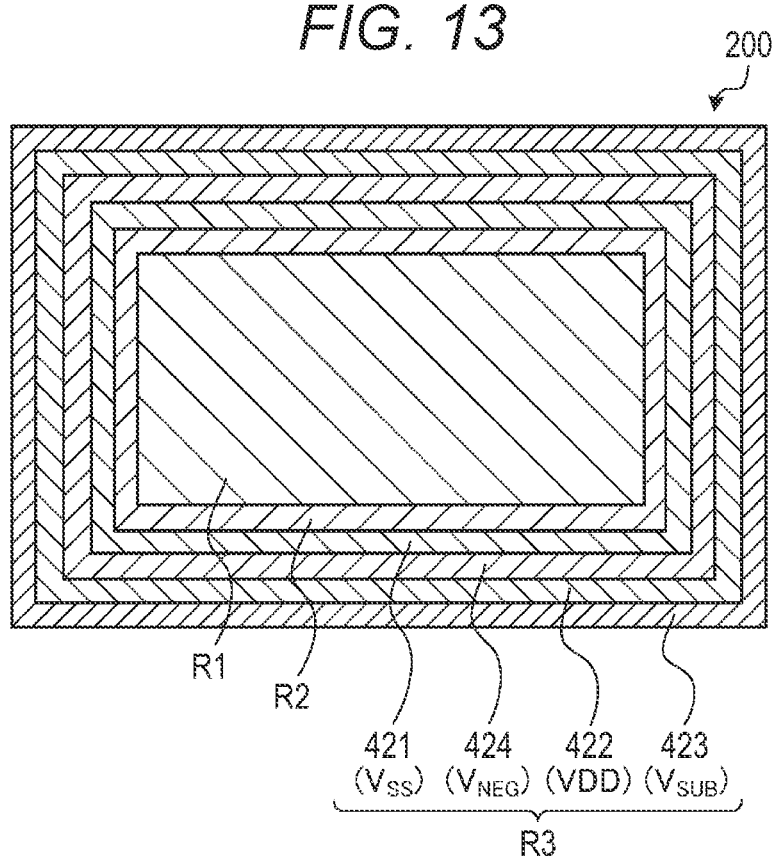
FIG. 13 is a view illustrating a planar configuration of the solid-state imaging device according to the embodiment of the present disclosure.

Next, a detailed configuration of the solid-state imaging device 200 is described with reference to FIGS. 12 and 13. FIG. 12 is a view illustrating a cross-sectional configuration of the solid-state imaging device 200 according to the embodiment of the present disclosure, mainly illustrating a cross-sectional structure of a peripheral portion of the solid-state imaging device 200. FIG. 13 is a view illustrating a planar configuration of the solid-state imaging device 200 according to the embodiment of the present disclosure.

As illustrated in FIG. 12, the solid-state imaging device 200 includes an effective pixel region R1, a dummy pixel region R2, a power supply region R3, and a pad region R4.

The effective pixel region R1 is the region in which the light reception unit 210 and the address event detection unit 230 are stacked. In the effective pixel region R1, a plurality of effective pixels 310 is arranged in a two-dimensional lattice manner.

As illustrated in FIG. 13, the dummy pixel region R2 is the region provided so as to surround four sides of the effective pixel region R1.

Furthermore, as illustrated in FIG. 12, a plurality of dummy pixels 310A is arranged side by side in the dummy pixel region R2. Such dummy pixel 310A basically has the same configuration as that of the effective pixel 310, but does not output a signal to the outside.

In the solid-state imaging device 200 according to the embodiment, by forming the dummy pixel region R2 so as to surround the four sides of the effective pixel region R1, process regularity from the center to edges of the effective pixel region R1 may be secured. Therefore, according to the embodiment, a manufacturing yield of the solid-state imaging device 200 may be improved.

As illustrated in FIG. 13, the power supply region R3 is the region provided so as to surround four sides of the dummy pixel region R2. The power supply region R3 includes second ground wiring 421 to which the second ground potential $V_{SS}$ is applied, power supply wiring 422 to which the power supply potential VDD is applied, power supply wiring 423 to which a substrate voltage $V_{SUB}$ is applied, and first ground wiring 424 to which the first ground potential $V_{NEG}$ is applied. The second ground wiring 421, the first ground wiring 424, the power supply wiring 422, and the power supply wiring 423 are formed into a ring shape around the dummy pixel region R2, for example.

The second ground wiring 421 supplies the second ground potential $V_{SS}$ to the amplification transistor 322 and the like of the plurality of effective pixels 310. The power supply wiring 422 supplies the power supply potential VDD to the plurality of effective pixels 310 and the like. The power supply wiring 423 supplies the substrate voltage $V_{SUB}$ of the same potential as the power supply potential VDD to a site other than the effective pixel region R1 and the dummy pixel region R2 of the solid-state imaging device 200. The first ground wiring 424 supplies the first ground potential $V_{NEG}$ to the photodiode 311 and the like of the plurality of effective pixels 310.

Each voltage is supplied from, for example, a power supply unit (not illustrated) provided around the circuit board 202 to the second ground wiring 421, the power supply wiring 422, the power supply wiring 433, and the first ground wiring 424. The power supply unit includes, for example, a charge pump circuit (not illustrated) and the like.

In the solid-state imaging device 200 according to the embodiment, the first ground potential $V_{NEG}$ is supplied from the first ground wiring 424 provided in the power supply region R3 located outside the effective pixel region R1 in which the effective pixels 310 are formed to the photodiode 311 of the plurality of effective pixels 310. Furthermore, the second ground potential $V_{SS}$ is supplied from the second ground wiring 421 provided in the power supply region R3 to a plurality of current-voltage conversion circuits. Therefore, the first ground potential $V_{NEG}$ different from the second ground potential $V_{SS}$ may be supplied to the photodiode 311, and the sensitivity of the photodiode 311 may be improved.

Furthermore, in the solid-state imaging device 200 according to the embodiment, by providing the power supply wiring 423 separately from the power supply wiring 422, even in a case where the power supply potential VDD fluctuates when the effective pixel 310 operates and the like, the substrate voltage $V_{SUB}$ may be stably supplied to the peripheral portion of the solid-state imaging device 200. Therefore, according to the embodiment, the solid-state imaging device 200 may be stably operated.

The pad region R4 is the region provided around the power supply region R3, and includes a contact hole 426 and a bonding pad 425. The contact hole 426 is formed in a thickness direction of the light reception substrate 201 and the circuit board 202 from a surface on a light incidence side of the light reception substrate 201 to the middle of the circuit board 202.

The bonding pad 425 is provided at the bottom of the contact hole 426. In the embodiment, a bonding wire and the like is joined to the bonding pad 425 via the contact hole 426, so that the recording unit 120 (refer to FIG. 1) or the control unit 130 (refer to FIG. 1) is electrically connected to each unit of the solid-state imaging device 200.

A configuration of the effective pixel 310 arranged in the effective pixel region R1 is further described with reference to FIG. 12. The solid-state imaging device 200 is obtained by stacking the light reception substrate 201 and the circuit board 202, and the joint 203 is provided at an interface between such light reception substrate 201 and circuit board 202.

The light reception substrate 201 includes a semiconductor layer 201a and an insulating layer 201b. The semiconductor layer 201a includes a semiconductor material such as silicon. In such semiconductor layer 201a, the photodiode 311, the LG transistor 321 (refer to FIG. 11), the amplification transistor 322 (refer to FIG. 11) and the like are formed for each effective pixel 310 and dummy pixel 310A.

Furthermore, in the semiconductor layer 201a, the pixel isolation unit 410 is formed so as to separate the adjacent effective pixels 310 and dummy pixels 310A from each other. The pixel isolation unit 410 electrically and optically isolates the adjacent effective pixels 310 and dummy pixels 310A from each other.

The pixel isolation unit 410 is formed so as to individually surround the effective pixel 310 and the dummy pixel 310A and to penetrate the semiconductor layer 201a, for example.

A planarizing film 411 is formed on a surface on a light incidence side of the semiconductor layer 201a, and an on-chip lens 412 is formed on a surface on a light incidence side of such planarizing film 411. The planarizing film 411 planarizes a surface on which the on-chip lens 412 is mounted.

The on-chip lens 412 is, for example, individually provided on the effective pixel 310 and the dummy pixel 310A, condenses the incident light, and guides the same to the effective pixel 310 and the dummy pixel 310A.

The insulating layer 201b includes an insulating material such as silicon oxide ($SiO_x$), silicon nitride (SiN), or silicon oxynitride (SiON), and is provided on a surface on a side opposite to the light incidence side on the semiconductor layer 201a.

Furthermore, a wiring unit 401 including a wiring layer, a via and the like is formed in the insulating layer 201b. Such wiring unit 401 is electrically connected to the photodiode 311, the PG transistor 321, and the amplification transistor 322 provided in the semiconductor layer 201a in the wiring configuration illustrated in FIG. 6.

The wiring unit 401 is electrically connected to the first pad 403 via the via 402. The first pad 403 is provided so as to be exposed on a surface on a side opposite to the surface on the light incidence side on the light reception substrate 201 (that is, the interface with the circuit board 202), and includes copper or a copper alloy.

Furthermore, the insulating layer 202a includes a second pad 404. The second pad 404 is provided so as to be exposed on a surface on a light incidence side on the circuit board 202 (that is, the interface with the light reception substrate 201), and includes copper or a copper alloy.

The second pad 404 is electrically connected to the wiring unit 406 via the via 405. The wiring unit 406 is electrically connected to the gate of the P-type transistor 332 (refer to FIG. 6) and the source of the P-type transistor 323 (refer to FIG. 6). Then, in the embodiment, the first pad 403 and the second pad 404 are directly joined by Cu—Cu joint.

In this manner, the solid-state imaging device 200 according to the embodiment is provided with a plurality of photodiodes 311 (an example of photoelectric conversion elements), a plurality of current-voltage conversion circuits 320, the address event detection unit 231, the first ground wiring 424, and the second ground wiring 421. The plurality of photodiodes 311 is arranged side by side in the effective pixel region R1. The plurality of current-voltage conversion circuits 320 converts the currents output from the plurality of photodiodes 311 into the voltages, respectively. The address event detection unit 231 detects a change in voltage output from each of the plurality of current-voltage conversion circuits 320. The first ground wiring 424 is provided in the voltage supply region R3 (an example of a second region) located outside the effective pixel region R1 (an example of a first region) and supplies the first ground potential $V_{NEG}$ to the plurality of photodiodes 311. The second ground wiring 421 is provided in the voltage supply region R3 and supplies the second ground potential $V_{SS}$ of the voltage value different from that of the first ground potential $V_{NEG}$ to the plurality of current-voltage conversion circuits 320.

Therefore, the first ground potential $V_{NEG}$ different from the second ground potential $V_{SS}$ (reference potential) may be supplied to the photodiode 311, and the sensitivity of the photodiode 311 may be improved.

7. First Variation

In the above-described embodiment, each voltage is supplied from the power supply unit (not illustrated) provided around the circuit board 202 to the power supply region R3, but there is no limitation. For example, each voltage may be externally supplied to the power supply region R3.

Figure 14:
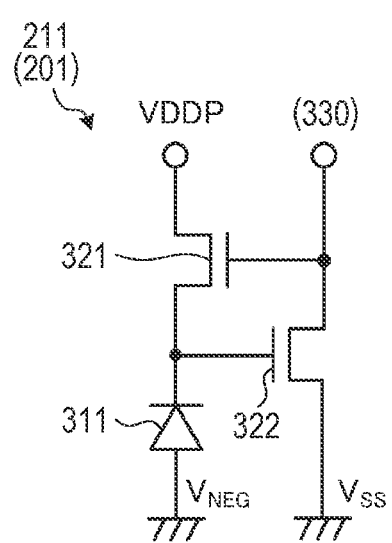
FIG. 14 is a view illustrating a configuration example of the light reception circuit according to a first variation of the embodiment of the present disclosure.
Figure 15:
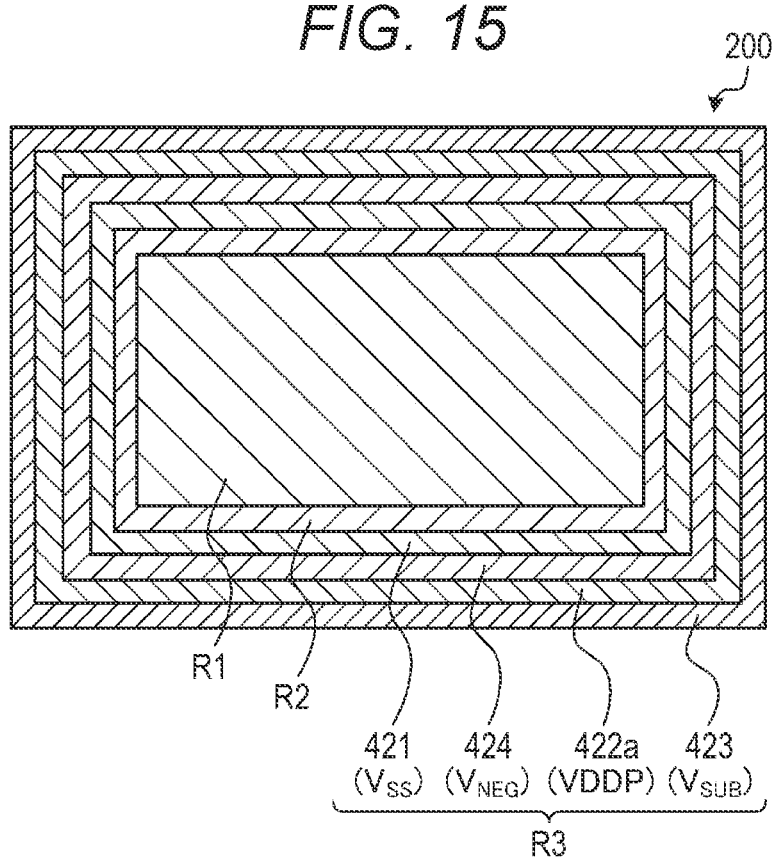
FIG. 15 is a view illustrating a planar configuration of the solid-state imaging device according to the first variation of the embodiment of the present disclosure.

FIG. 14 is a view illustrating a configuration example of the light reception circuit 211 according to a first variation of the embodiment of the present disclosure. FIG. 15 is a view illustrating a planar configuration of the solid-state imaging device 200 according to the first variation of the embodiment of the present disclosure.

As illustrated in FIG. 14, the drain of the LG transistor 321 of the light reception circuit 211 is externally connected to a terminal of power supply potential VDDP. Furthermore, as illustrated in FIG. 15, the external power supply potential VDDP is supplied from power supply wiring 422a to the drain of the LG transistor 321 and the like via the power supply wiring 422a of the power supply region R3.

In this manner, by supplying the power supply potential VDDP from the outside of the solid-state imaging device 200, the power supply potential VDDP may be uniformly supplied to the light reception circuit 211 and the like.

Note that, in the above-described embodiment and first variation, the power supply region R3 is formed into the ring shape around the effective pixel region R1 and the dummy pixel region R2, but there is no limitation. The power supply region R3 may be provided so as to surround three sides of the dummy pixel region R2, for example. Alternatively, the power supply region R3 may be provided along two sides or one side of the dummy pixel region R2, for example.

8. Second Variation

In the above-described embodiment, the solid-state imaging device 200 detects the address event, but there is no limitation. For example, the solid-state imaging device 200 may acquire a gradation image together with the detection of the address event.

Figure 16:
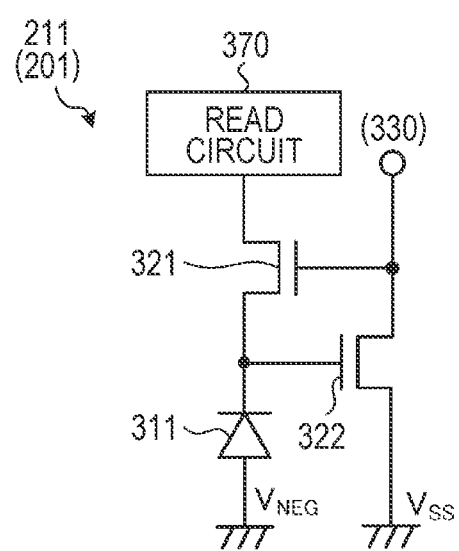
FIG. 16 is a view illustrating an example of the light reception circuit according to a second variation of the embodiment of the present disclosure.

FIG. 16 is a view illustrating an example of the light reception circuit 211 according to a second variation of the embodiment of the present disclosure. As illustrated in FIG. 16, in a case where the solid-state imaging device 200 acquires the gradation image, the drain of the LG transistor 321 is connected not to the terminal of the power supply potential VDD but to a read circuit 370.

The read circuit 370 generates a pixel signal on the basis of the photocurrent from the photodiode 311. The read circuit 370 includes a pixel transistor (not illustrated) including a transfer transistor, a reset transistor, a selection transistor, an amplification transistor and the like, for example. Furthermore, although not illustrated, the solid-state imaging device 200 may include a drive circuit and an output circuit provided on the circuit board 202. The drive circuit includes a shift register, an address decoder and the like, and drives each effective pixel 310. Furthermore, the output circuit includes a column AD and the like, and outputs the pixel signal read by the read circuit 370 to the storage unit 120 (refer to FIG. 1).

Figure 17:
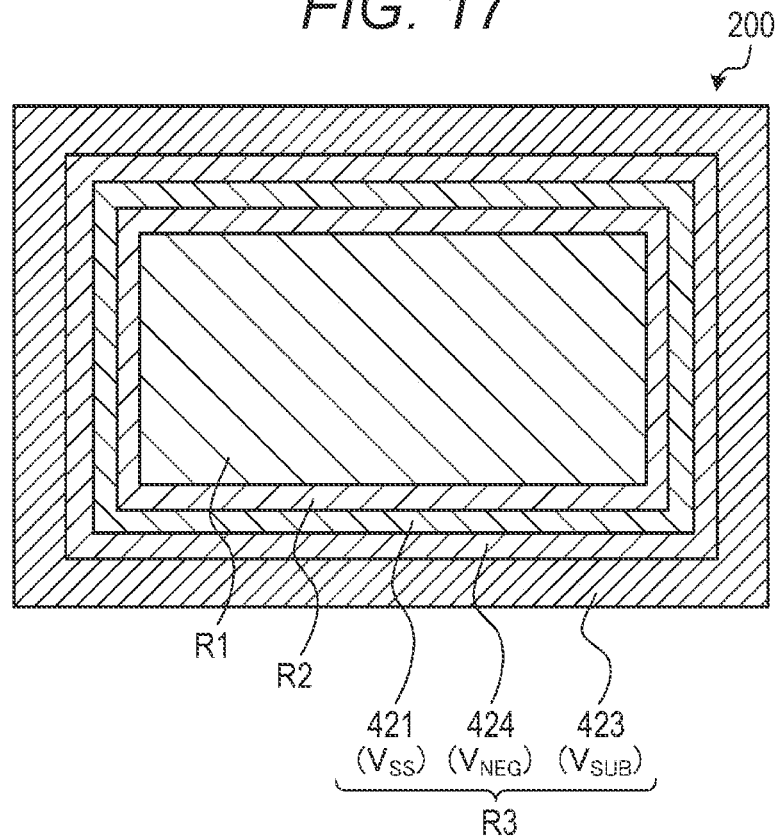
FIG. 17 is a view illustrating a planar configuration of the solid-state imaging device according to the second variation of the embodiment of the present disclosure.

FIG. 17 is a view illustrating a planar configuration of the solid-state imaging device 200 according to the second variation of the embodiment of the present disclosure.

In this variation, the drain of the LG transistor 321 is connected not to the terminal of the power supply potential VDD but to the read circuit 370. Therefore, as illustrated in FIG. 17, power supply wiring 422 of the power supply region R3 may be omitted.

9. Third Variation

Figure 18:
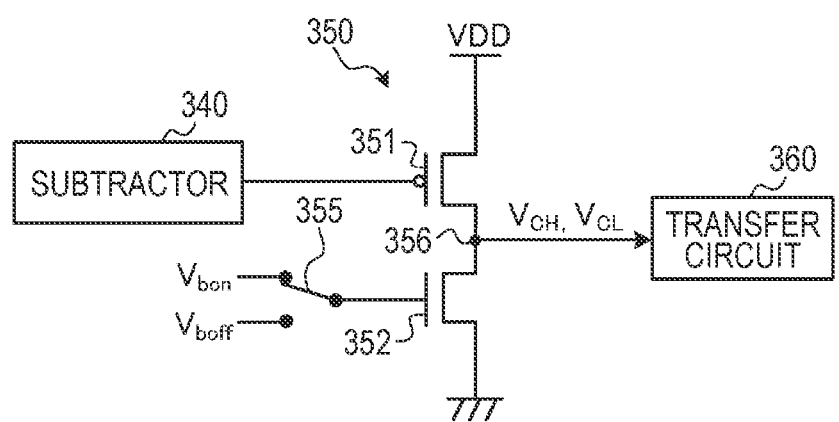
FIG. 18 is a view illustrating a circuit configuration of the effective pixel according to a third variation of the embodiment of the present disclosure.

FIG. 18 is a view illustrating a circuit configuration of the effective pixel 310 according to a third variation of the embodiment of the present disclosure, illustrating the quantizer 350 that detects presence or absence of any one of selected on event or off event.

The quantizer 350 according to the third variation includes the P-type transistor 351, the N-type transistor 352, and a switch 355. The P-type transistors 351 and the N-type transistor 352 are connected in series in this order between the terminal of the power supply potential VDD and the terminal of the ground potential.

Furthermore, the gate of the P-type transistor 351 is connected to the output terminal of the subtractor 340. The gate of the N-type transistor 352 is connected to the switch 355.

Then, the control unit 130 may apply the bias voltage $V_{bon}$ indicating the upper limit threshold or the bias voltage $V_{boff}$ indicating the lower limit threshold to the gate of the N-type transistor 352 by switching the switch 355. A connection point 356 between the P-type transistor 351 and the N-type transistor 352 is connected to the transfer circuit 360.

Then, in a case where the bias voltage \T$_{bon}$ is applied to the gate of the N-type transistor 352, in the quantizer 350 according to the third variation, a voltage at the connection point 356 is output to the transfer circuit 360 as the on event detection signal $V_{CH}$.

In contrast, in a case where the bias voltage $V_{boff}$ is applied to the gate of the N-type transistor 352, in the quantizer 350 according to the third variation, the voltage at the connection point 356 is output to the transfer circuit 360 as the off event detection signal $V_{CL}$.

With such a configuration, the quantizer 350 according to the third variation outputs the on event detection signal $V_{CH}$ at the high level when the differential signal exceeds the upper limit threshold in a case where the on event is selected by the control unit 130.

In contrast, the quantizer 350 according to the third variation outputs the off event detection signal $V_{CL}$ at the low level when the differential signal falls below the lower limit threshold in a case where the off event is selected by the control unit 130.

For example, in the solid-state imaging element 200 according to the third variation, when a light source not illustrated is turned on by a command of the control unit 130 and the like, the control unit 130 may select the on event, so that the on event detection signal $V_{CH}$ may be efficiently output.

Furthermore, in the solid-state imaging element 200 according to the third variation, when the light source not illustrated is turned off by the command of the control unit 130 and the like, the control unit 130 may select the off event, so that the off event detection signal $V_{CL}$ may be efficiently output.

In the third variation described heretofore, since the number of transistors forming the quantizer 350 may be reduced, a chip area of the solid-state imaging element 200 may be reduced, and power consumption of the solid-state imaging element 200 may be reduced.

10. Fourth Variation

Figure 19:
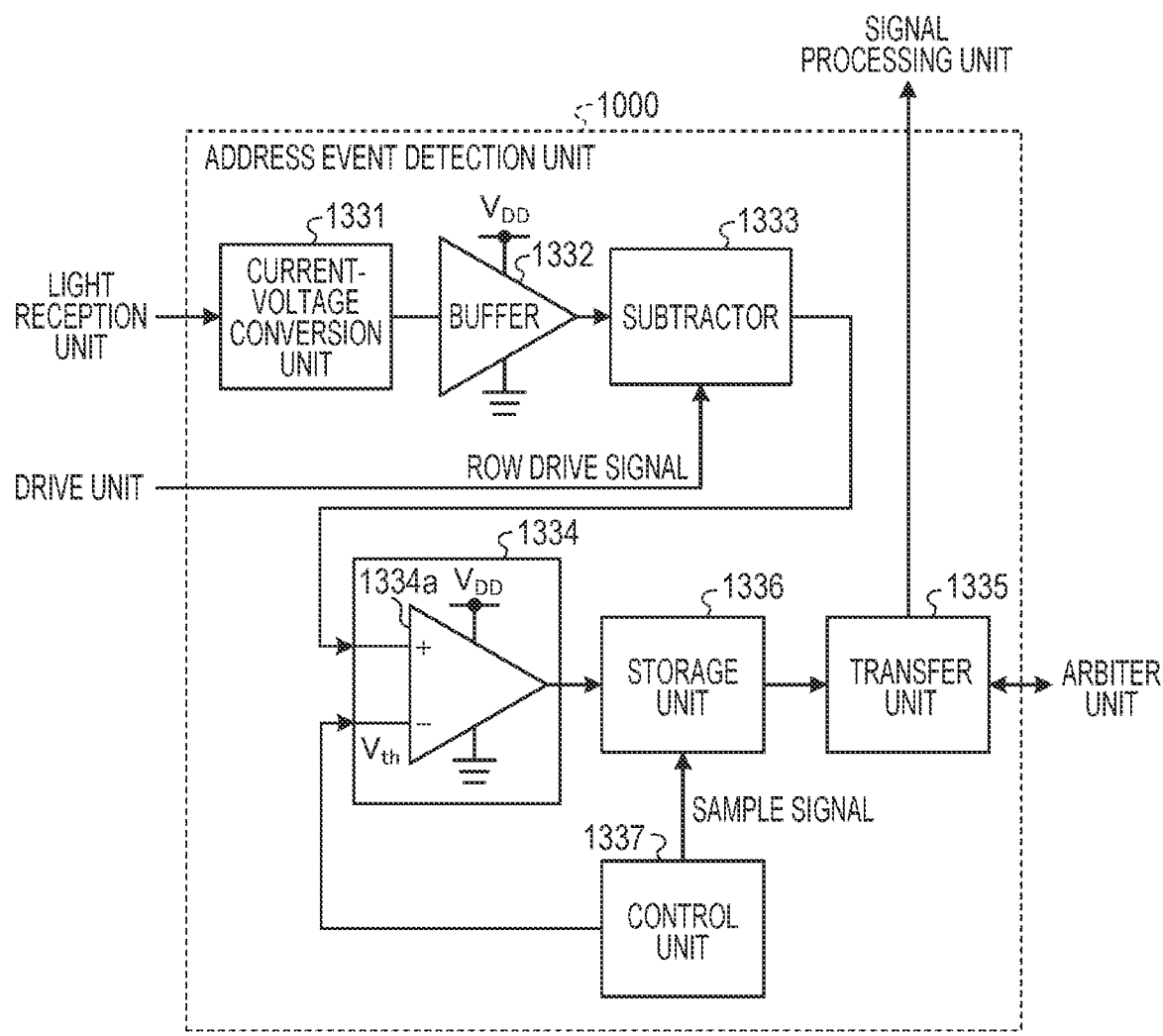
FIG. 19 is a block diagram illustrating a configuration example of an address event detection unit according to a fourth variation of the embodiment of the present disclosure.

In addition to the address event detection unit 231 described in the above-described embodiment, the solid-state imaging device 200 may be provided with an address event detection unit 1000 having a configuration as illustrated in FIG. 19. FIG. 19 is a block diagram illustrating a configuration example of the address event detection unit 1000 according to a fourth variation of the embodiment of the present disclosure. As illustrated in FIG. 19, the address event detection unit 1000 according to this configuration example includes a storage unit 1336 and a control unit 1337 in addition to a current-voltage conversion unit 1331, a buffer 1332, a subtractor 1333, a quantizer 1334, and a transfer unit 1335.

The storage unit 1336 is provided between the quantizer 1334 and the transfer unit 1335, and accumulates an output of the quantizer 1334, that is, a comparison result of a comparator 1334a on the basis of a sample signal supplied from the control unit 1337. The storage unit 1336 may be a sampling circuit such as a switch, plastic, or capacitance, or may be a digital memory circuit such as a latch or a flip-flop.

The control unit 1337 supplies a predetermined threshold voltage Vth to an inverting (−) input terminal of the comparator 1334a. The threshold voltage Vth supplied from the control unit 1337 to the comparator 1334a may have different voltage values in a time division manner. For example, the control unit 1337 supplies a threshold voltage Vth1 corresponding to an on event indicating that an amount of change in photocurrent exceeds an upper limit threshold and a threshold voltage Vth2 corresponding to an off event indicating that the change amount falls below a lower limit threshold at different timings, so that one comparator 1334a may detect a plurality of types of address events.

For example, the storage unit 1336 may accumulate the comparison result of the comparator 1334a using the threshold voltage Vth1 corresponding to the on event in a period in which the threshold voltage Vth2 corresponding to the off event is supplied from the control unit 1337 to the inverting (−) input terminal of the comparator 1334a. Note that the storage unit 1336 may be located inside a pixel 2030 (refer to FIG. 20) or outside the pixel 2030. Furthermore, the storage unit 1336 is not an essential component of the address event detection unit 1000. That is, the storage unit 1336 may be omitted.

11. Fifth Variation

The imaging device 100 described in the above-described embodiment is an asynchronous imaging device that reads the event by an asynchronous reading method. Note that, an event reading method is not limited to the asynchronous reading method, and may be a synchronous reading method. The imaging device to which the synchronous reading method is applied is a scan type imaging device, the same as a normal imaging device that performs imaging at a predetermined frame rate.

Figure 20:
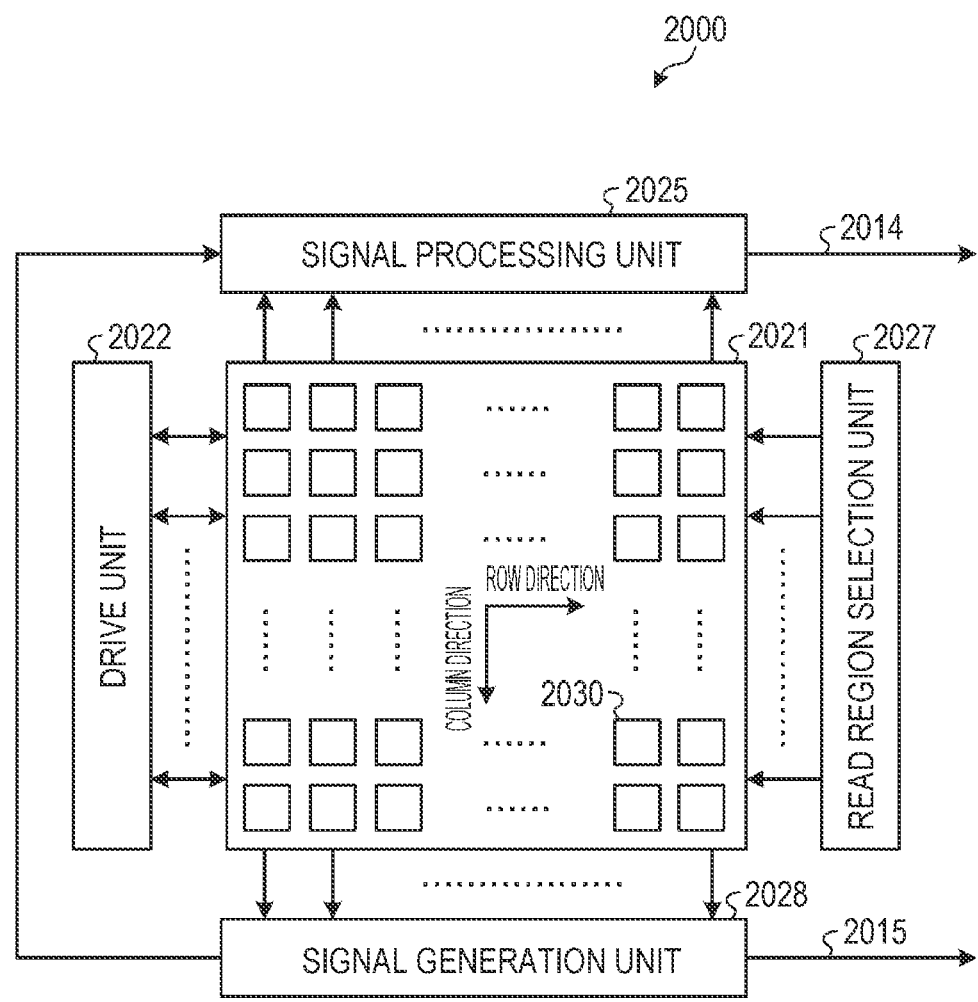
FIG. 20 is a block diagram illustrating an example of a configuration of an imaging device in an imaging system according to a fifth variation of the embodiment of the present disclosure.

FIG. 20 is a block diagram illustrating an example of a configuration of an imaging device 2000 in an imaging system according to a fifth variation of the embodiment of the present disclosure.

As illustrated in FIG. 20, the imaging device 2000 is provided with a pixel array unit 2021, a drive unit 2022, a signal processing unit 2025, a read region selection unit 2027, and a signal generation unit 2028.

The pixel array unit 2021 includes a plurality of pixels 2030. The plurality of pixels 2030 outputs an output signal in response to a selection signal of the read region selection unit 2027. Each of the plurality of pixels 2030 may have a quantizer comparator in the pixel. The plurality of pixels 2030 outputs the output signal corresponding to a change amount of intensity of light. The plurality of pixels 2030 may be two-dimensionally arranged in a matrix as illustrated in FIG. 20.

The drive unit 2022 drives each of the plurality of pixels 2030 to output a pixel signal generated in each pixel 2030 to the signal processing unit 2025. Note that, the drive unit 2022 and the signal processing unit 2025 are circuit units for acquiring gradation information. Therefore, in a case where only event information is acquired, the drive unit 2022 and the signal processing unit 2025 may be omitted.

The read region selection unit 2027 selects some of the plurality of pixels 2030 included in the pixel array unit 2021. Specifically, the read region selection unit 2027 determines a selected region in response to a request from each pixel 2030 of the pixel array unit 2021. For example, the read region selection unit 2027 selects any one or a plurality of rows among rows included in a structure of a two-dimensional matrix corresponding to the pixel array unit 2021. The read region selection unit 2027 sequentially selects one or a plurality of rows according to a cycle set in advance. Furthermore, the read region selection unit 2027 may determine the selected region in response to the request from each pixel 2030 of the pixel array unit 2021.

On the basis of the output signal of the pixel selected by the read region selection unit 2027, the signal generation unit 2028 generates an event signal corresponding to an active pixel in which the event is detected among the selected pixels. The event is the event in which the intensity of light changes. The active pixel is the pixel in which the change amount of the intensity of light corresponding to the output signal exceeds or falls below a threshold set in advance. For example, the signal generation unit 2028 compares the output signal of the pixel with a reference signal, detects the active pixel that outputs the output signal in a case where this is larger or smaller than the reference signal, and generates the event signal corresponding to the active pixel.

The signal generation unit 2028 may include a column selection circuit that arbitrates a signal entering the signal generation unit 2028, for example. Furthermore, the signal generation unit 2028 may be configured to output not only the information of the active pixel in which the event is detected but also the information of an inactive pixel in which the event is not detected.

The address information and time stamp information (for example, (X,Y,T)) of the active pixel in which the event is detected are output from the signal generation unit 2028 through an output line 2015. Note that, the data output from the signal generation unit 2028 may be not only the address information and the time stamp information but also information in a frame format (for example, (0, 0, 1, 0, . . . )).

12. Application Example

The technology of the present disclosure is applicable to, for example, a structured light distance measuring system. The distance measuring system according to an application example of the present disclosure is the system for measuring a distance to a subject using a structured light method technology. Furthermore, the distance measuring system according to this application example may also be used as a system for acquiring a three-dimensional (3D) image, and in this case, this may be referred to as a three-dimensional image acquisition system. In the structured light method, distance measurement is performed by identifying coordinates of a point image and a light source (a so-called point light source) from which the point image is projected by pattern matching.

Figure 21:
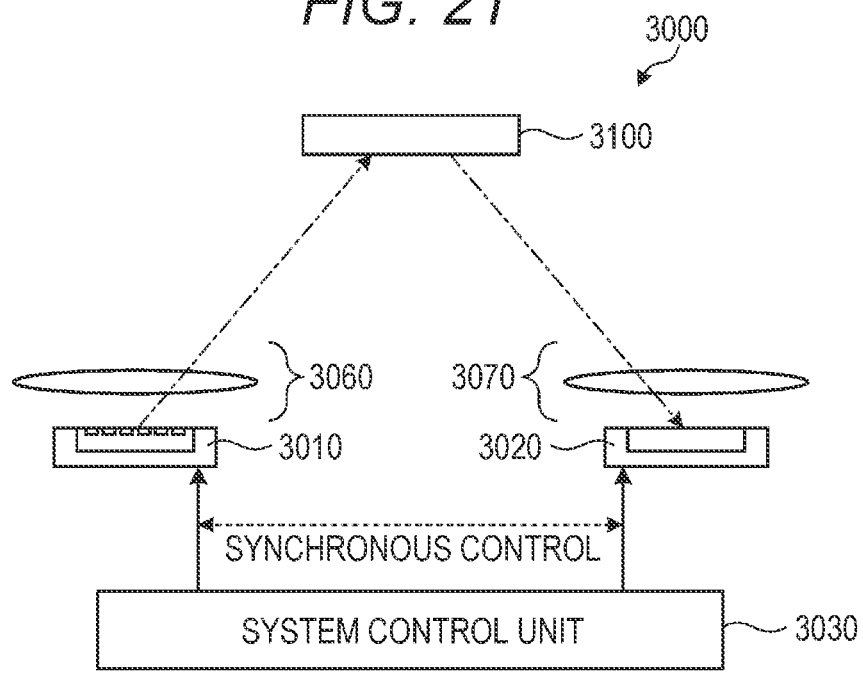
FIG. 21 is a schematic diagram illustrating an example of a configuration of a distance measuring system according to the embodiment of the present disclosure.
Figure 22:
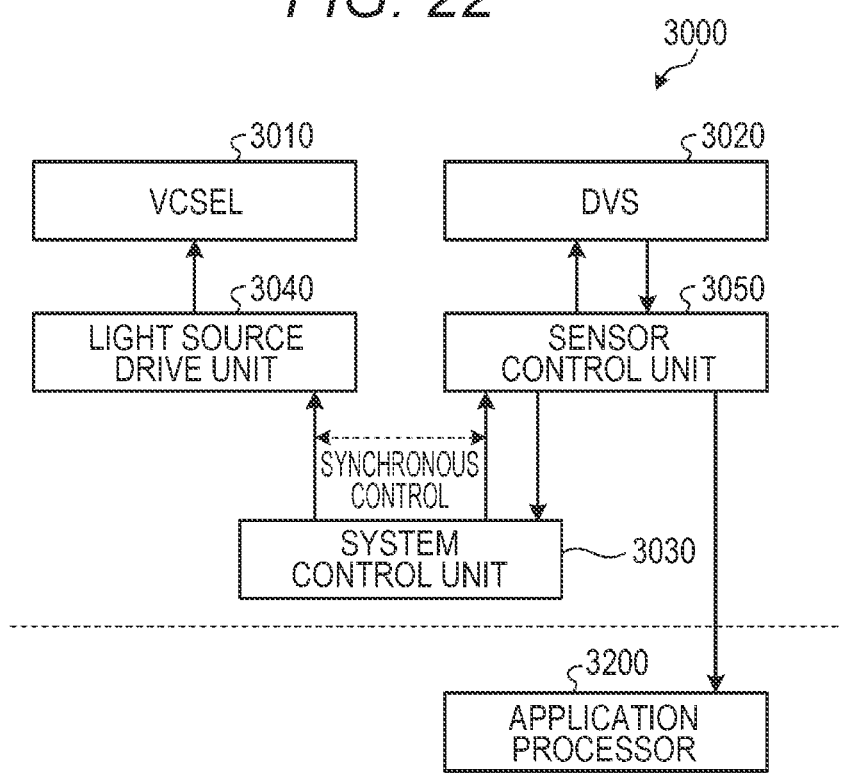
FIG. 22 is a block diagram illustrating an example of a circuit configuration according to the embodiment of the present disclosure.

FIG. 21 is a schematic diagram illustrating an example of a configuration of the distance measuring system according to the embodiment of the present disclosure, and FIG. 22 is a block diagram illustrating an example of a circuit configuration according to the embodiment of the present disclosure.

A distance measuring system 3000 according to this embodiment uses a surface emitting semiconductor laser, for example, a vertical cavity surface emitting laser (VCSEL) 3010 as a light source unit, and uses an event detection sensor 3020 referred to as DVS as a light reception unit. The vertical cavity surface emitting laser (VCSEL) 3010 projects predetermined pattern of light onto the subject. The distance measuring system 3000 according to this embodiment is provided with a system control unit 3030, a light source drive unit 3040, a sensor control unit 3050, a light source side optical system 3060, and a camera side optical system 3070 in addition to the vertical cavity surface emitting laser 3010 and the event detection sensor 3020.

The system control unit 3030 includes, for example, a processor (CPU), drives the vertical cavity surface emitting laser 3010 via the light source drive unit 3040, and drives the event detection sensor 3020 via the sensor control unit 3050. More specifically, the system control unit 3030 synchronously controls the vertical cavity surface emitting laser 3010 and the event detection sensor 3020.

In the distance measuring system 3000 according to this embodiment having the above-described configuration, the light of a predetermined pattern emitted from the vertical cavity surface emitting laser 3010 is projected to a subject (measurement target) 3100 through the light source side optical system 3060. This projected light is reflected by the subject 3100. Then, the light reflected by the subject 3100 is incident on the event detection sensor 3020 through the camera side optical system 3070. The event detection sensor 3020 receives the light reflected by the subject 3100, and detects that a change in luminance of the pixel exceeds a predetermined threshold as an event. Event information detected by the event detection sensor 3020 is supplied to an application processor 3200 outside the distance measuring system 3000. The application processor 3200 performs predetermined processing on the event information detected by the event detection sensor 3020.

13. Conclusion

In each embodiment of the present disclosure described above, the solid-state imaging element 100 is described in which a first conductivity type is P-type, a second conductivity type is N-type, and electrons are used as signal charges, but the embodiment of the present disclosure is not limited to such an example. For example, each embodiment may be applied to the solid-state imaging element 100 in which the first conductivity type is N type, the second conductivity type is P type, and holes are used as signal charges. In this case, the first ground potential $V_{NEG}$ is larger than the second ground potential $V_{SS}$.

Although the preferred embodiment of the present disclosure is described above in detail with reference to the attached drawings, the technical scope of the present disclosure is not limited to such examples. It is clear that one of ordinary skill in the technical field of the present disclosure may conceive of various modifications or corrections within the scope of the technical idea recited in claims, and it is understood that they also naturally belong to the technical scope of the present disclosure.

Furthermore, the effects described in this specification are merely illustrative or exemplary, and are not limiting. That is, the technology according to the present disclosure may exhibit other effects obvious to those skilled in the art from the description of this specification together with or in place of the effects described above.

Note that, the following configurations also belong to the technical scope of the present disclosure.

(1)

A solid-state imaging device provided with:
a plurality of photoelectric conversion elements arranged side by side in a first region;
a plurality of current-voltage conversion circuits that converts currents output from the plurality of photoelectric conversion elements into voltages, respectively;
a plurality of address event detection circuits that detects changes in the voltages output from the plurality of current-voltage conversion circuits, respectively;
first ground wiring that is provided in a second region located outside the first region and supplies first ground potential to the plurality of photoelectric conversion elements; and
second ground wiring that is provided in the second region and supplies second ground potential having a voltage value different from a voltage value of the first ground potential to the plurality of current-voltage conversion circuits.

(2)

The solid-state imaging device according to (1), in which the voltage value of the first ground potential is smaller than the voltage value of the second ground potential.

(3)

The solid-state imaging device according to (1) or (2), further provided with power supply wiring that is provided in the second region and supplies power supply potential to the current-voltage conversion circuits.

(4)

The solid-state imaging device according to (1) or (2), further provided with a read circuit that reads the currents output from the plurality of photoelectric conversion elements and outputs pixel signals corresponding to the currents, respectively.

(5)

The solid-state imaging device according to any one of (1) to (4), in which
a current-voltage conversion circuit includes a loop-shaped source follower circuit,
the source follower circuit including:
a first transistor a source of which is connected to a photoelectric conversion element; and
a second transistor a gate of which is connected to the photoelectric conversion element and a drain of which is connected to a gate of the first transistor,
the source of the first transistor arranged so as to be connected to the substantial center of the photoelectric conversion element in a cross section obtained by cutting a stacked substrate in a stacking direction of the stacked substrate on which the plurality of photoelectric conversion elements is formed.

(6)

The solid-state imaging device according to (5), in which the source of the first transistor is arranged closer to the photoelectric conversion element than the drain of the first transistor in the cross section.

(7)

The solid-state imaging device according to (5) or (6), in which a distance between a source of the second transistor and the photoelectric conversion element is substantially the same as an interval between the drain of the second transistor and the photoelectric conversion element in the cross section.

(8)

The solid-state imaging device according to any one of (5) to (7), in which
the source follower circuit further includes:
a third transistor a source of which is connected to a drain of the first transistor; and
a fourth transistor a source of which is connected to the gate of the first transistor and the drain of the second transistor, and a gate of which is connected to the drain of the first transistor and the source of the third transistor,
the third and fourth transistors provided in a fourth region facing a third region in which the second transistor is provided across the first transistor in the cross section.

(9)

The solid-state imaging device according to (8), in which
a distance between the source of the third transistor and the photoelectric conversion element is substantially the same as an interval between a drain of the third transistor and the photoelectric conversion element in the cross section, and
a distance between the source of the fourth transistor and the photoelectric conversion element is substantially the same as an interval between a drain of the fourth transistor and the photoelectric conversion element in the cross section.

(10)

The solid-state imaging device according to (8) or (9), in which the first ground potential is applied to the stacked substrate via a contact region provided in the second region at a position farther from the photoelectric conversion element than the second transistor in the cross section.

(11)
An imaging device provided with:
a solid-state imaging device;
an optical system that captures incident light from a subject to form an image on an imaging surface of the solid-state imaging element; and
a control unit that controls the solid-state imaging element,
the solid-state imaging device provided with:
 a plurality of photoelectric conversion elements arranged side by side in a first region;
 a plurality of current-voltage conversion circuits that converts currents output from the plurality of photoelectric conversion elements into voltages, respectively;
 a plurality of address event detection circuits that detects changes in the voltages output from the plurality of current-voltage conversion circuits, respectively;
 first ground wiring that is provided in a second region located outside the first region and supplies first ground potential to the plurality of photoelectric conversion elements; and
 second ground wiring that is provided in the second region and supplies second ground potential having a voltage value different from a voltage value of the first ground potential to the plurality of current-voltage conversion circuits.

REFERENCE SIGNS LIST

100 Imaging device
110 Imaging lens
130 Control unit
200 Solid-state imaging device
231, 231A Address event detection circuit
310 Effective pixel
310A Dummy pixel
311, 311A Photodiode
320, 320A Current-voltage conversion circuit
421, 424 Ground wiring
422, 423 Power supply wiring
R1 Effective pixel region
R2 Dummy pixel region
R3 Power supply region

What is claimed is:

1. A solid-state imaging device, comprising:
a plurality of photoelectric conversion elements arranged side by side in a first region;
a plurality of current-voltage conversion circuits that convert currents output from the plurality of photoelectric conversion elements into voltages, respectively;
a plurality of address event detection circuits that detect changes in the voltages output from the plurality of current-voltage conversion circuits, respectively;
first ground wiring that is provided in a second region located outside the first region and that supplies first ground potential to the plurality of photoelectric conversion elements; and
second ground wiring that is provided in the second region and that supplies second ground potential having a voltage value different from a voltage value of the first ground potential to the plurality of current-voltage conversion circuits,
wherein each current-voltage conversion circuit in the plurality of current-voltage conversion circuits includes a loop-shaped source follower circuit,
the source follower circuit including:
 a first transistor, wherein a source of the first transistor is directly connected to a photoelectric conversion element of the plurality of photoelectric conversion elements, and wherein the source of the first transistor is connected to a substantial center of the photoelectric conversion element in a cross section obtained by cutting a stacked substrate in a stacking direction of the stacked substrate on which the plurality of photoelectric conversion elements is formed; and
 a second transistor, wherein a gate of the second transistor is directly connected to the photoelectric conversion element, and wherein a drain of the second transistor is connected to a gate of the first transistor.

2. The solid-state imaging device according to claim 1, wherein the voltage value of the first ground potential is smaller than the voltage value of the second ground potential.

3. The solid-state imaging device according to claim 1, further comprising power supply wiring that is provided in the second region and supplies power supply potential to the current-voltage conversion circuits.

4. The solid-state imaging device according to claim 1, further comprising a read circuit that reads the currents output from the plurality of photoelectric conversion elements and outputs pixel signals corresponding to the currents, respectively.

5. The solid-state imaging device according to claim 1, wherein the source of the first transistor is arranged closer to the photoelectric conversion element than the drain of the first transistor in the cross section.

6. The solid-state imaging device according to claim 1, wherein a distance between a source of the second transistor and the photoelectric conversion element is substantially same as an interval between the drain of the second transistor and the photoelectric conversion element in the cross section.

7. The solid-state imaging device according to claim 1, wherein the source follower circuit further includes:
a third transistor, a source of which is connected to a drain of the first transistor; and
a fourth transistor, a source of which is connected to the gate of the first transistor and the drain of the second transistor, and a gate of which is connected to the drain of the first transistor and the source of the third transistor,
the third and fourth transistors provided in a fourth region facing a third region in which the second transistor is provided across the first transistor in the cross section.

8. The solid-state imaging device according to claim 7, wherein
a distance between the source of the third transistor and the photoelectric conversion element is substantially same as an interval between a drain of the third transistor and the photoelectric conversion element in the cross section, and
a distance between the source of the fourth transistor and the photoelectric conversion element is substantially same as an interval between a drain of the fourth transistor and the photoelectric conversion element in the cross section.

9. The solid-state imaging device according to claim 7, wherein the first ground potential is applied to the stacked substrate via a contact region provided in the second region at a position farther from the photoelectric conversion element than the second transistor in the cross section.

10. An imaging device, comprising:
a solid-state imaging device;
an optical system that captures incident light from a subject to form an image on an imaging surface of the solid-state imaging device; and
a control unit that controls the solid-state imaging device,
the solid-state imaging device including:
  a plurality of photoelectric conversion elements arranged side by side in a first region;
  a plurality of current-voltage conversion circuits that convert currents output from the plurality of photoelectric conversion elements into voltages, respectively;
  a plurality of address event detection circuits that detect changes in the voltages output from the plurality of current-voltage conversion circuits, respectively;
  first ground wiring that is provided in a second region located outside the first region and that supplies first ground potential to the plurality of photoelectric conversion elements; and
  second ground wiring that is provided in the second region and that supplies second ground potential having a voltage value different from a voltage value of the first ground potential to the plurality of current-voltage conversion circuits,
wherein each current-voltage conversion circuit in the plurality of current-voltage conversion circuits includes a loop-shaped source follower circuit,
the source follower circuit including:
  a first transistor, wherein a source of the first transistor is directly connected to a photoelectric conversion element of the plurality of photoelectric conversion elements, and wherein the source of the first transistor is connected to a substantial center of the photoelectric conversion element in a cross section obtained by cutting a stacked substrate in a stacking direction of the stacked substrate on which the plurality of photoelectric conversion elements is formed; and
  a second transistor, wherein a gate of the second transistor is directly connected to the photoelectric conversion element, and wherein a drain of the second transistor is connected to a gate of the first transistor.

* * * * *